(12) United States Patent
Hashinoki et al.

(10) Patent No.: US 7,069,099 B2
(45) Date of Patent: Jun. 27, 2006

(54) METHOD OF TRANSPORTING AND PROCESSING SUBSTRATES IN SUBSTRATE PROCESSING APPARATUS

(75) Inventors: Kenji Hashinoki, Kamikyo-ku (JP); Yasufumi Koyama, Kamikyo-ku (JP); Takaharu Yamada, Kamikyo-ku (JP)

(73) Assignee: Dainippon Screen MFG. Co., Ltd. (JP)

( * ) Notice: Subject to any disclaimer, the term of this patent is extended or adjusted under 35 U.S.C. 154(b) by 43 days.

(21) Appl. No.: 10/769,390

(22) Filed: Jan. 30, 2004

(65) Prior Publication Data
US 2004/0182318 A1     Sep. 23, 2004

(30) Foreign Application Priority Data
Feb. 3, 2003   (JP) ............................ P2003-025706
Sep. 17, 2003  (JP) ............................ P2003-324513

(51) Int. Cl.
*G06F 19/00* (2006.01)

(52) U.S. Cl. ................ 700/112; 700/110; 700/111; 700/113; 700/121; 700/123

(58) Field of Classification Search ................ 700/112, 700/110, 111, 113, 121, 123
See application file for complete search history.

(56) References Cited

U.S. PATENT DOCUMENTS 6,768,930 B1 *  7/2004  Oh ............................ 700/217
6,809,510 B1 * 10/2004  Goetzke ................... 324/158.1

FOREIGN PATENT DOCUMENTS

JP          7-283094      10/1995

* cited by examiner

*Primary Examiner*—Leo Picard
*Assistant Examiner*—Michael D. Masinick
(74) *Attorney, Agent, or Firm*—Ostrolenk, Faber, Gerb & Soffen, LLP

(57) ABSTRACT

A substrate processing apparatus includes a plurality of cells each including a predetermined processing unit, a transport mechanism, and a cell controller. The cell controller independently controls operations in each cell in accordance with transport setting and processing condition setting for each cell described in recipe data determined for each substrate unit to be processed. Because the processing and transport are performed independently of the operations of adjacent cells, substrates belonging to different substrate units are received through a feed inlet or the same substrate inlet, are processed while being present in the same cell, and are transported to a feed outlet and a return outlet which are different substrate outlets. This allows the presence of different process flows in parallel.

6 Claims, 13 Drawing Sheets

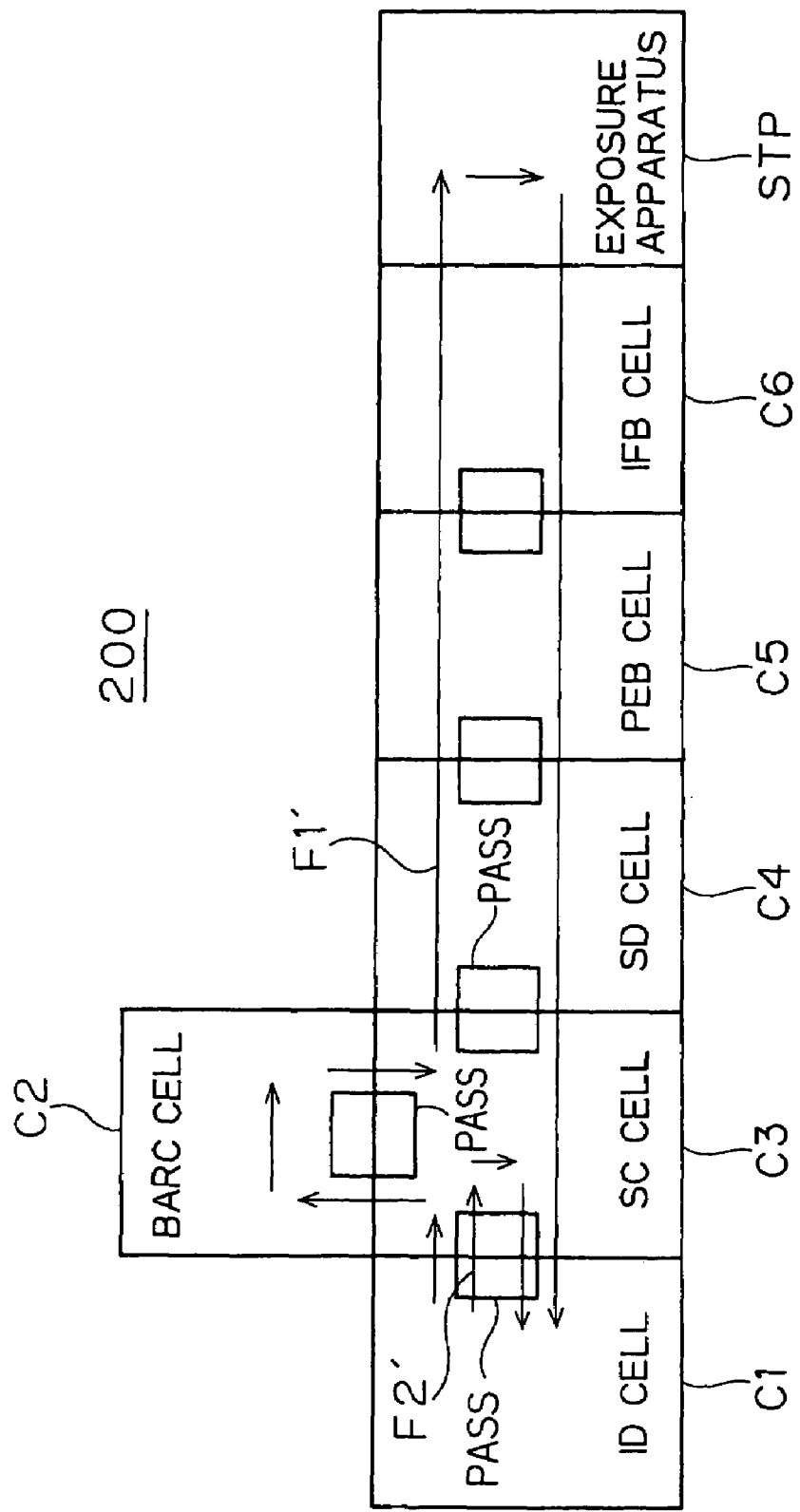

METHOD OF TRANSPORTING AND PROCESSING SUBSTRATES IN SUBSTRATE PROCESSING APPARATUS

BACKGROUND OF THE INVENTION

1. Field of the Invention

The present invention relates to a method of transporting substrates including a semiconductor substrate, a glass substrate for a liquid crystal device and the like in a substrate processing apparatus including a plurality of processing units each for performing a predetermined process on these substrates.

2. Description of the Background Art

In a substrate processing apparatus which performs various processes on semiconductor substrates (or wafers), glass substrates and the like in the process steps of manufacturing semiconductor devices, liquid crystal devices and the like, attempts have been made at a multi-unit structure in which there are provided a plurality of processing units all responsible for a single process step and at a hybrid structure in which there are provided different types of processing units for performing a succession of different process steps in a single apparatus, thereby to respond to a request of manufacturers for improvement in throughput. The improvement in throughput, however, is not achieved only by such hybrid arrangement, but significantly depends on how efficiently to operate the processing units.

In general, such a substrate processing apparatus performs a process on a series of lots in accordance with a predetermined process flow, and thereafter performs the process on the subsequent lots. There may be situations where a processing unit not included in the process flow is completely out of operation, depending on the details of the process flow. To better the situations, a technique has been known, for example, in which a process in a preceding process flow is interrupted by the execution of a process in another process flow not competing with the preceding process flow. Such a technique is disclosed, for example, in Japanese Patent Application Laid-Open No. 7-283094 (1995).

The control algorithm in the method disclosed in Japanese Patent Application Laid-Open No. 7-283094 (1995) increases in complexity as the substrate processing apparatus increases in size. It is therefore difficult to achieve high efficiency while maintaining the reliability of processing. Further, the interrupt process depends on the details of the preceding process flow, and is limited in executability. There arise another problem in that installation of an additional processing unit requires the construction of a new process flow.

SUMMARY OF THE INVENTION

The present invention is intended for an apparatus for performing a predetermined process on a group of substrates, the processing procedure of the group of substrates being determined for each substrate unit to be processed including at least one substrate. According to a first aspect of the present invention, the apparatus comprises a plurality of cells each including: at least one processing unit; at least one substrate inlet; a plurality of substrate outlets; a transport element for transporting a substrate between the at least one processing unit, the at least one substrate inlet and the plurality of substrate outlets; and a controller for controlling the at least one processing unit and the transport element, wherein the controller in each of the plurality of cells controls the transport element so that a substrate received into each cell by way of the at least one substrate inlet is transferred outwardly of each cell by way of one of the plurality of substrate outlets which is determined by transport setting established for each cell and for a substrate unit to which the substrate belongs, and so that substrates determined to be transferred outwardly by way of the one of the plurality of substrate outlets by the transport setting are transferred outwardly in the order in which the substrates are made ready for outward transfer.

Preferably, according to a second aspect of the present invention, the apparatus of the first aspect of the present invention further comprises a plurality of substrate rest parts provided between adjacent two of the plurality of cells, one of the plurality of substrate rest parts serving as the at least one substrate inlet of one of the two adjacent cells and as one of the plurality of substrate outlets of the other of the two adjacent cells, the remainder of the plurality of substrate rest parts serving as one of the plurality of substrate outlets of the one of the two adjacent cells and as the at least one substrate inlet of the other of the two adjacent cells, wherein the controller in each of the plurality of cells determines the order in which substrates are to be transferred outwardly by way of the one of the substrate outlets of each cell by referencing a substrate placement state signal and the transport setting, the substrate placement state signal being applied from a predetermined sensor and indicating whether or not a substrate is placed on a corresponding one of the substrate rest parts.

Preferably, according to a third aspect of the present invention, in the apparatus of the second aspect of the present invention, the predetermined sensor is provided in the corresponding one of the substrate rest parts.

Preferably, according to a fourth aspect of the present invention, in the apparatus of the second aspect of the present invention, the predetermined sensor is provided in the transport element.

According to a fifth aspect of the present invention, the apparatus comprises a plurality of cells each including: at least one processing unit; a transport element for transporting a substrate; and a controller for controlling the at least one processing unit and the transport element, wherein the controller in each of the plurality of cells controls the at least one processing unit and the transport element so that a first substrate belonging to a first substrate unit is received into each cell before the completion of an intra-cell process of a second substrate preceding the first substrate and belonging to a second substrate unit different in transport setting from the first substrate unit, and so that the first and second substrates are processed and transported in accordance with the transport setting for the first and second substrate units, respectively.

Preferably, according to a sixth aspect of the present invention, in the apparatus of the fifth aspect of the present invention, each of the plurality of cells further includes at least one substrate inlet, and a plurality of substrate outlets. The controller in each of the plurality of cells controls the transport element so that a substrate received into each cell by way of the at least one substrate inlet is transferred outwardly of each cell by way of one of the plurality of substrate outlets which is determined by transport setting established for each cell and for a substrate unit to which the substrate belongs, and so that substrates determined to be transferred outwardly by way of the one of the plurality of substrate outlets by the transport setting are transferred outwardly in the order in which the substrates are made ready for outward transfer when a plurality of substrates belonging to the substrate units different in the transport setting are present in each cell at the same time.

Preferably, according to a seventh aspect of the present invention, in the apparatus of the first aspect of the present invention, the at least one processing unit in at least one of the plurality of cells includes at least one of a processing unit for processing a substrate using a chemical solution and a thermal processing unit for heating or cooling a substrate.

The present invention is also intended for a method of transporting substrates in a substrate processing apparatus, the substrate processing apparatus processing and transporting substrates belonging to a plurality of substrate units to be processed, each of the substrate units including at least one substrate, the substrate processing apparatus including a plurality of cells, each of the plurality of cells including at least one processing unit, at least one substrate inlet, a plurality of substrate outlets, and a transport element for transporting a substrate between the at least one processing unit, the at least one substrate inlet and the plurality of substrate outlets. According to an eight aspect of the present invention, the method comprises the steps of: (a) receiving a substrate into each cell by way of the at least one substrate inlet; and (b) transferring the substrate outwardly of each cell by way of any of the plurality of substrate outlets, wherein, in the step (b), the substrate is transferred outwardly by way of one of the plurality of substrate outlets determined by transport setting established for each cell and for one of the substrate units to which the substrate belongs, and wherein, in the step (b), substrates determined to be transferred outwardly by way of the one of the plurality of substrate outlets by the transport setting are transferred outwardly in the order in which the substrates are made ready for outward transfer.

Preferably, according to a ninth aspect of the present invention, in the method of the eighth aspect of the present invention, the substrate processing apparatus further includes a plurality of substrate rest parts between adjacent two of the plurality of cells, one of the plurality of substrate rest parts serving as the at least one substrate inlet of one of the two adjacent cells and as one of the plurality of substrate outlets of the other of the two adjacent cells, the remainder of the plurality of substrate rest parts serving as one of the plurality of substrate outlets of the one of the two adjacent cells and as the at least one substrate inlet of the other of the two adjacent cells. The order in which substrates are to be transferred outwardly by way of the one of the substrate outlets of each cell is determined by referencing a substrate placement state signal and the transport setting, the substrate placement state signal indicating whether or not a substrate is placed on a corresponding one of the substrate rest parts.

The present invention is also intended for a method of processing substrates in a substrate processing apparatus, the substrate processing apparatus processing and transporting substrates belonging to a plurality of substrate units to be processed, each of the substrate units including at least one substrate, the substrate processing apparatus including a plurality of cells, each of the plurality of cells including at least one processing unit, and a transport element for transporting a substrate. According to a tenth aspect of the present invention, the method comprises the steps of: (a) receiving a substrate into each cell; and (b) transporting the substrate in each cell by means of the transport element, wherein, in the step (b), a substrate is transported in accordance with transport setting established for each cell and for each substrate unit, and wherein, in the step (a), a first substrate belonging to a first substrate unit is received into each cell before the completion of an intra-cell process of a second substrate preceding the first substrate and belonging to a second substrate unit different in transport setting from the first substrate unit.

Preferably, according to an eleventh aspect of the present invention, in the method of the tenth aspect of the present invention, each of the plurality of cells further includes at least one substrate inlet, and a plurality of substrate outlets. A substrate received into each cell by way of the at least one substrate inlet is transferred outwardly of each cell by way of one of the plurality of substrate outlets which is determined by transport setting established for each cell and for one of the substrate units to which the substrate belongs. Substrates determined to be transferred outwardly by way of the one of the plurality of substrate outlets by the transport setting are transferred outwardly in the order in which the substrates are made ready for outward transfer when a plurality of substrates belonging to the substrate units different in the transport setting are present in each cell at the same time.

Preferably, according to a twelfth aspect of the present invention, in the apparatus of the first aspect of the present invention, the at least one substrate inlet includes a plurality of substrate inlets. The at least one processing unit includes a plurality of processing units. The controller in each of the plurality of cells allows the transport element to outwardly transfer a substrate made ready for outward transfer earlier when substrates belonging to a plurality of substrate units different in transport setting are received into each cell by way of a common one of the plurality of substrate inlets and are subjected to an intra-cell process in a common one of the plurality of processing units.

Preferably, according to a thirteenth aspect of the present invention, in the apparatus of the fifth aspect of the present invention, each of the plurality of cells further includes a plurality of substrate inlets and a plurality of substrate outlets. The at least one processing unit includes a plurality of processing units. The controller in each of the plurality of cells controls the transport element so that a substrate received into each cell by way of one of the plurality of substrate inlets is transferred outwardly of each cell by way of one of the plurality of substrate outlets which is determined by the transport setting. The controller in each of the plurality of cells allows the transport element to receive the first substrate into each cell before the completion of the intra-cell process of the second substrate when substrates belonging to a plurality of substrate units different in transport setting are received into each cell by way of a common one of the plurality of substrate inlets and are subjected to the intra-cell process in a common one of the plurality of processing units.

Preferably, according to a fourteenth aspect of the present invention, in the method of the eighth aspect of the present invention, the at least one substrate inlet includes a plurality of substrate inlets. The at least one processing unit includes a plurality of processing units. A substrate made ready for outward transfer earlier is allowed to be transferred outwardly of each cell when substrates belonging to a plurality of substrate units different in transport setting are received into each cell by way of a common one of the plurality of substrate inlets and are subjected to an intra-cell process in a common one of the plurality of processing units.

Preferably, according to a fifteenth aspect of the present invention, in the method of the tenth aspect of the present invention, each of the plurality of cells in the substrate processing apparatus further includes a plurality of substrate inlets and a plurality of substrate outlets. The at least one processing unit in each of the plurality of cells includes a plurality of processing units. A substrate received into each cell by way of one of the plurality of substrate inlets is transferred outwardly of each cell by way of one of the plurality of substrate outlets which is determined by the transport setting. The first substrate is allowed to be received into each cell before the completion of the intra-cell process of the second substrate when substrates belonging to a plurality of substrate units different in transport setting are received into each cell by way of a common one of the plurality of substrate inlets and are subjected to the intra-cell process in a common one of the plurality of processing units.

In the first to fourth, eighth and ninth aspects of the present invention, appropriate determination of the transport setting for each substrate unit allows the branching of a substrate transport path for each substrate unit in any cell, and also allows substrates having followed different transport paths to be transferred outwardly of each cell by way of the same substrate outlet in the order different from the order in which the substrates are received into each cell. Consequently, double-flow processing is implemented while independent transport of the substrates in each cell is achieved.

In the second to fourth, and ninth aspects of the present invention, the substrate ready for outward transfer is allowed to be transferred outwardly only by acquiring the information indicating that the transport element in the adjacent cell has received a substrate from the substrate rest part. Therefore, the double-flow processing is implemented without complicated control.

In the fourth aspect of the present invention, the information about substrate transport is used to determine whether or not a substrate is placed on the substrate rest part. Therefore, the double-flow processing is implemented without the need to provide a sensor in the substrate rest part.

In the fifth, sixth, tenth and eleventh aspects of the present invention, the substrate received into each cell is transported in accordance with the transport setting for each cell and subjected to the predetermined process independently of the transport path of the substrate before and after each cell. Therefore, substrates having different transport settings may be present and processed in each cell.

In the sixth and eleventh aspects of the present invention, the substrates having followed different transport paths are transferred outwardly of each cell by way of the same substrate outlet in the order different from the order in which the substrates are received into each cell. Consequently, the double-flow processing is implemented while independent transport of the substrates in each cell is achieved.

In the seventh aspect of the present invention, when substrates belonging to different substrate units are present in each cell, the substrates determined to be transported outwardly by way of a predetermined substrate outlet by the transport setting are transferred outwardly in the order in which the substrates are made ready for outward transfer in timed relation to the chemical or thermal process.

In the twelfth and fourteenth aspects of the present invention, when the substrates belonging to a plurality of substrate units different in transport setting are received into each cell by way of the common substrate inlet and are subjected to the intra-cell process in the common processing unit, a substrate made ready for outward transfer earlier is allowed to be transferred outwardly. This means that when the substrate transport path for each substrate unit is in a flow (branching flow) in the direction of branching into a plurality of transport paths, the substrate made ready for outward transfer earlier is allowed to be transferred outwardly if there is a processing unit the use of which is shared between the plurality of transport paths. In such a branching flow, the control of the substrate processing orders in the respective transport paths avoids the subsequent conflict between flows. Therefore, the throughput is improved without the occurrence of the conflict between the flows.

In the thirteenth and fifteenth aspects of the present invention, when the substrates belonging to a plurality of substrate units different in transport setting are received into each cell by way of the common substrate inlet and are subjected to the intra-cell process in the common processing unit, the first substrate is allowed to be received into each cell before the completion of the intra-cell process of the second substrate preceding the first substrate. This means that when the substrate transport path for each substrate unit is in the flow (branching flow) in the direction of branching into a plurality of transport paths, the first substrate is allowed to be received into each cell before the completion of the intra-cell process of the second substrate preceding the first substrate if there is a processing unit the use of which is shared between the plurality of transport paths. In such a branching flow, the control of the substrate processing orders in the respective transport paths avoids the subsequent conflict between flows. Therefore, the throughput is improved without the occurrence of the conflict between the flows.

It is therefore an object of the present invention to provide a substrate processing apparatus which allows the presence of processes in different process flows in parallel by the use of a simple control algorithm if the number of processing units increases.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 shows a modification of the arrangement of the cells.

DESCRIPTION OF THE PREFERRED EMBODIMENTS

<Overall Construction>

Figure 1:
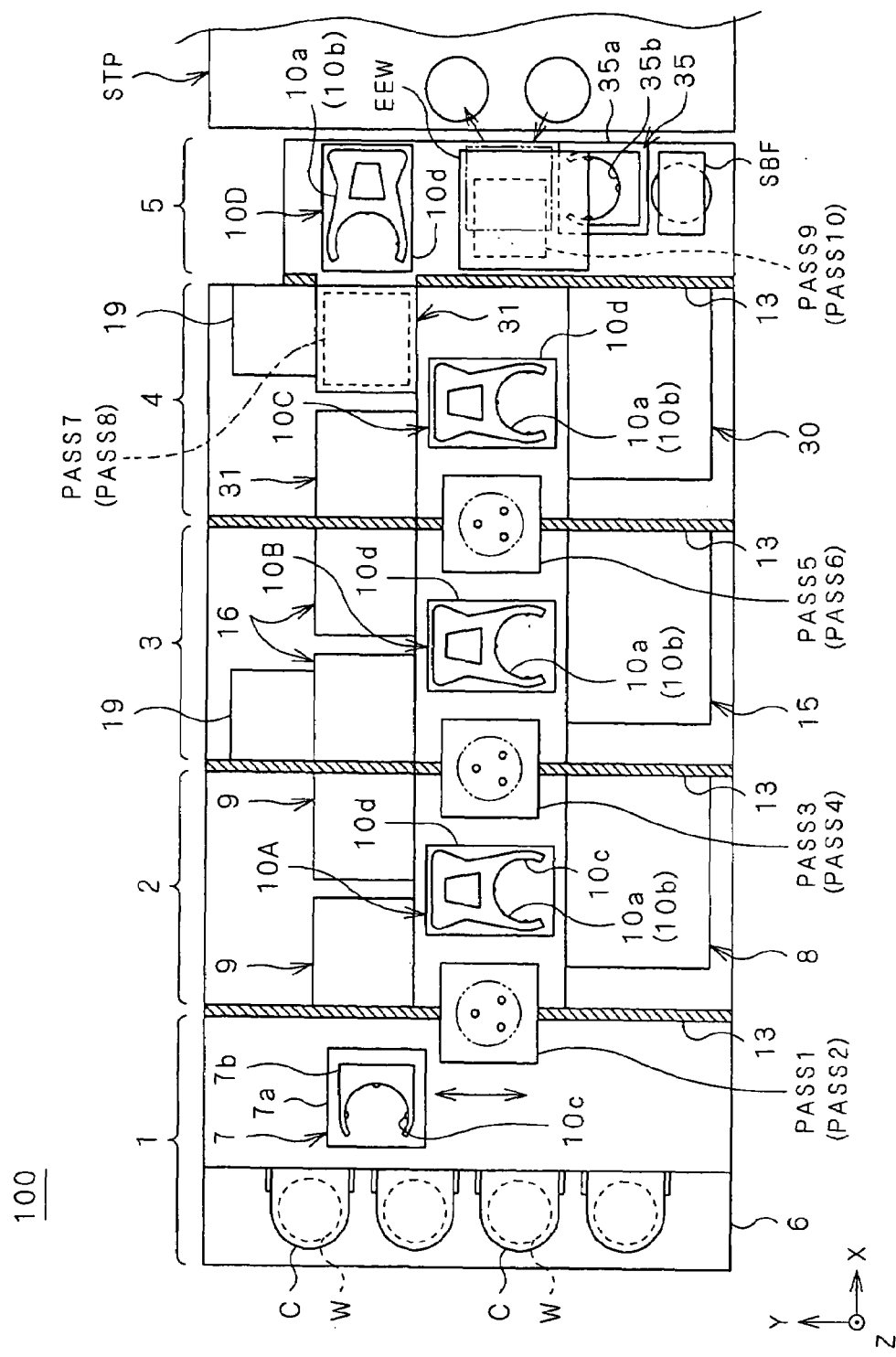
FIG. 1 is a plan view of a substrate processing apparatus.

FIG. 1 is a plan view of a substrate processing apparatus 100 according to a preferred embodiment of the present invention. The substrate processing apparatus 100 is responsible for a resist coating process, a development process, their associated predetermined thermal and chemical processes, and the like for a photolithography process step for forming a predetermined circuit pattern on a semiconductor substrate (referred to simply as a "substrate"). A three-dimensional coordinate system is additionally shown in FIG. 1 in which a horizontal plane including an X axis defined to extend in the longitudinal direction of the substrate processing apparatus 100 is defined as an XY plane and a Z axis is defined to extend in a vertically upward direction.

As shown in FIG. 1, the substrate processing apparatus 100 according to the preferred embodiment principally comprises: an indexer block (ID block) 1; an anti-reflection film processing block (BARC block) 2; a resist film processing block (SC block) 3; a development processing block (SD block) 4; and an interface block (IFB block) 5. In the substrate processing apparatus 100, the five blocks 1 to 5 are arranged in adjacent relation in the order named. An exposure apparatus (or stepper) STP responsible for the process of exposing a resist film in the form of a predetermined circuit pattern is provided in adjacent relation to the IFB block 5. The blocks 1 to 5 are assembled to individual frames which in turn are connected in the order named to construct the substrate processing apparatus 100 (See FIG. 6A). In the substrate processing apparatus 100, a predetermined supply part not shown supplies a downflow of clean air into each of the blocks 1 to 5 to thereby avoid the adverse effects of raised particles and gas flows upon the processes. The interior of each of the blocks 1 to 5 is held at a slightly positive pressure relative to the exterior to prevent particles and contaminants from entering the blocks 1 to 5. In particular, the air pressure in the BARC block 2 is set at a pressure higher than that in the ID block 1. This prevents the atmosphere in the ID block 1 from flowing into the BARC block 2 to allow each processing block to perform its process without being influenced by the outside atmosphere.

<ID Block>

The ID block 1 is a block for receiving unprocessed substrates W from the outside of the substrate processing apparatus 100 and for transferring processed substrates W to the outside. The ID block 1 comprises a cassette table 6 for placing thereon a plurality of (in FIG. 1, four) cassettes C in juxtaposition each capable of storing a predetermined number of substrates W in tiers, and an indexer-specific transport mechanism 7 for taking out the unprocessed substrates W in order from each of the cassette C for post-stage processing and for receiving the processed substrates W to store the processed substrates W in order into each of the cassettes C.

Figure 2:
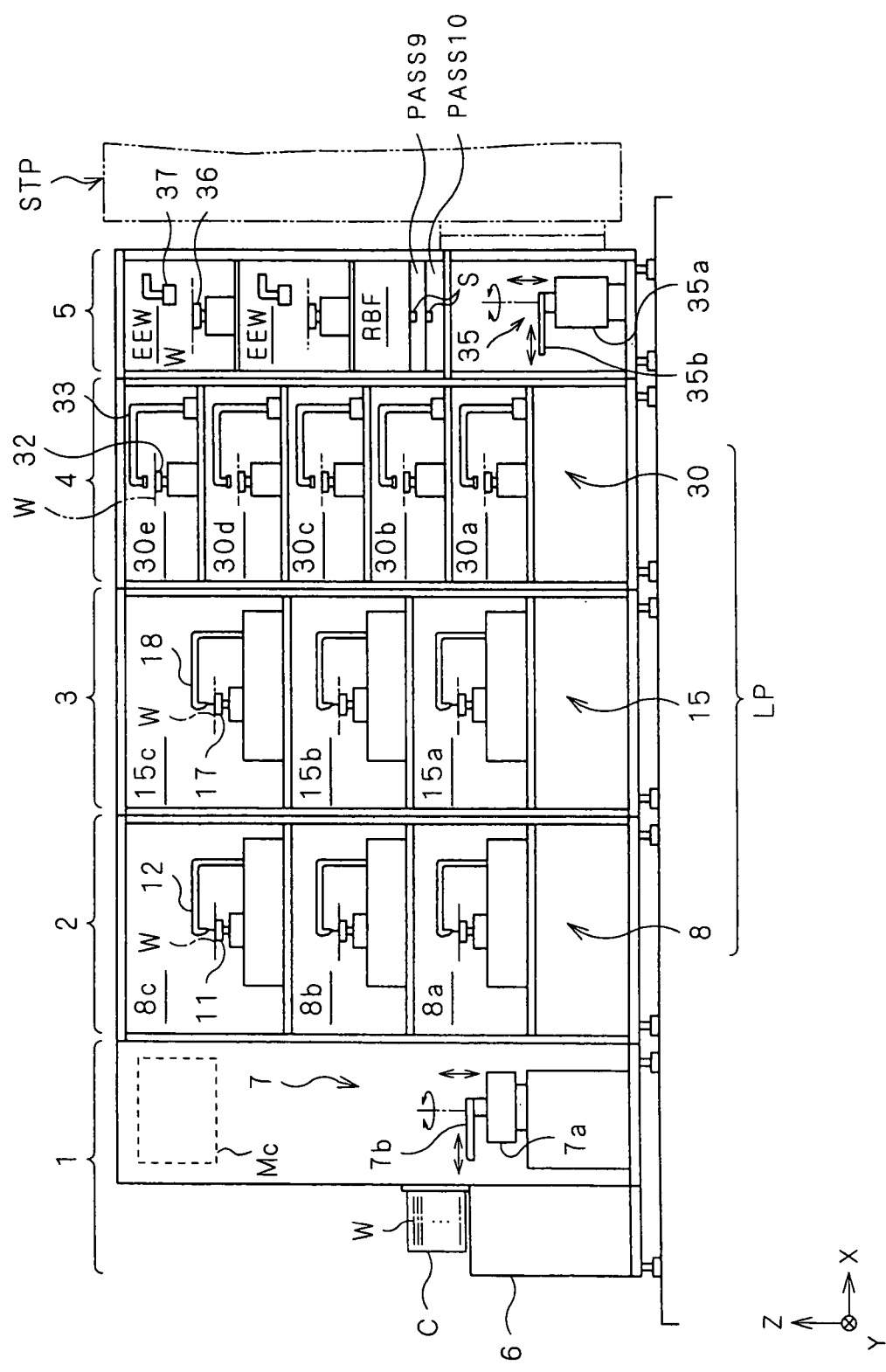
FIG. 2 is a front view of the substrate processing apparatus.

The indexer-specific transport mechanism 7 includes a movable table 7a horizontally movable along the Y axis toward and away from the cassette table 6, a holding arm 7b provided over the movable table 7a and for holding a substrate W in a horizontal position, and a plurality of (in FIG. 1, three) pins 10c projecting inwardly of a distal end portion of the holding arm 7b (See FIG. 2). The holding arm 7b is capable of moving vertically along the Z axis, pivoting within a horizontal plane and moving back and forth in the direction of the pivot radius. The substrate W is held in the horizontal position by the pins 10c.

The transfer of a substrate W in the ID block 1 will be briefly described. First, the indexer-specific transport mechanism 7 moves horizontally to a position opposed to a predetermined cassette C. Then, the holding arm 7b moves vertically and moves back and forth to take out an unprocessed substrate W from the cassette C. With the substrate W held by the holding arm 7b, the indexer-specific transport mechanism 7 moves horizontally to a position opposed to upper and lower substrate rest parts PASS1 and PASS2 to be described later. The indexer-specific transport mechanism 7 places the substrate W held on the holding arm 7b onto the upper substrate rest part PASS1 provided for outward transfer of substrates. If a processed substrate W is placed on the lower substrate rest part PASS2 provided for return of substrates, the indexer-specific transport mechanism 7 receives the processed substrate W onto the holding arm 7b to store the processed substrate W into a predetermined cassette C. Subsequently, the indexer-specific transport mechanism 7 repeats the operation of taking out an unprocessed substrate W out of a cassette C to transport the unprocessed substrate W to the substrate rest part PASS1 and the operation of receiving a processed substrate W from the substrate rest part PASS2 to store the processed substrate W into a cassette C.

<BARC Block, SC Block and SD Block>

Figure 3:
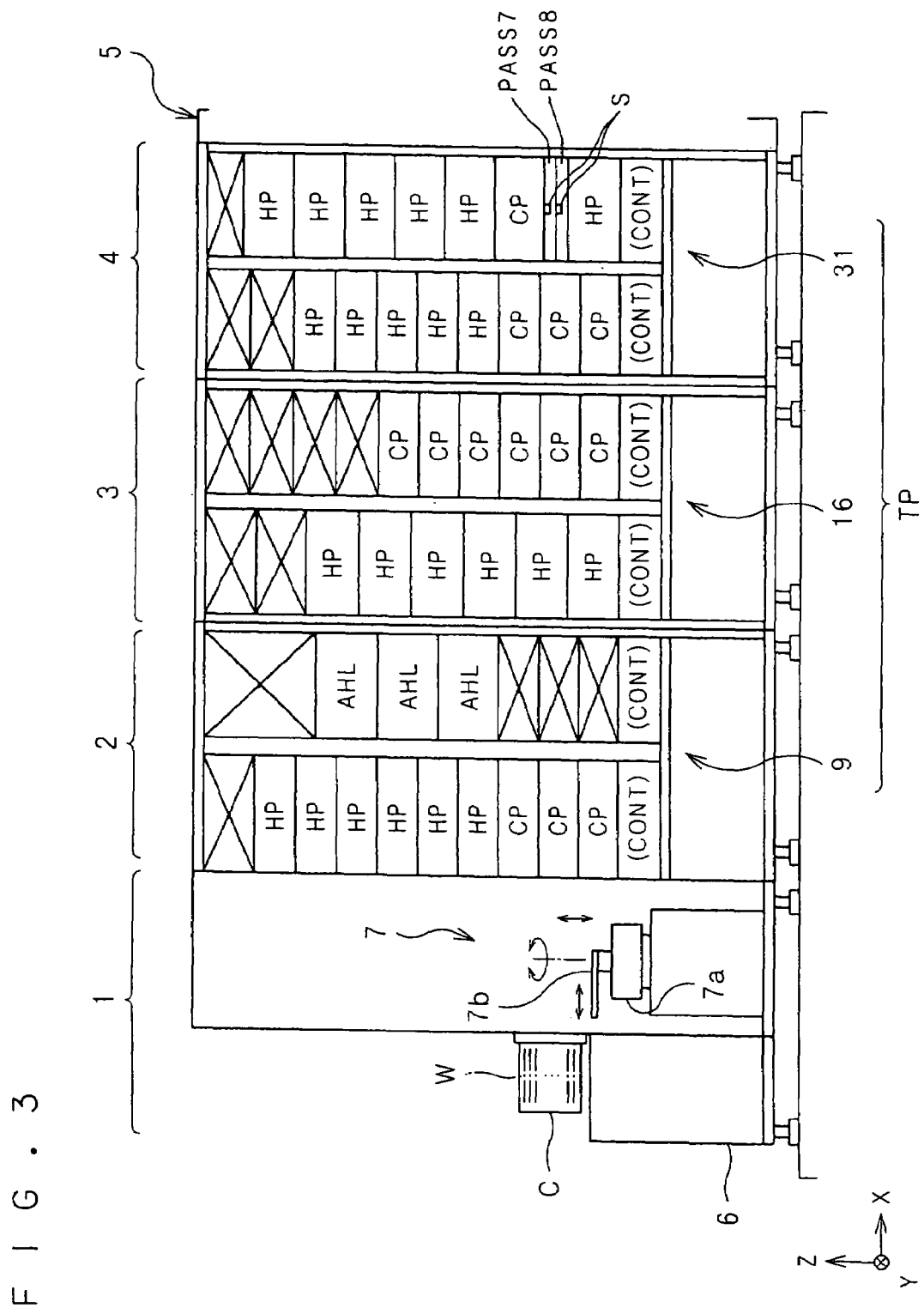
FIG. 3 shows the arrangement of a thermal processor.

FIG. 2 is a front view of the substrate processing apparatus 100, and shows the arrangement of a chemical processor LP to be described later. FIG. 3 shows the arrangement of a thermal processor TP to be described later as seen in the same direction as in FIG. 2. The BARC block 2, the SC block 3 and the SD block 4 will be described with reference to FIGS. 1 to 3.

The BARC block 2 is responsible for the process of forming an anti-reflection film for reducing standing waves or halation occurring during the exposure in the exposure apparatus STP under a photoresist film. The BARC block 2 comprises a first coating processor 8 for coating the surface of a substrate W with the anti-reflection film, a first thermal processor 9 for performing a thermal process required for the coating, and a first main transport mechanism 10A for transferring and receiving the substrate W to and from the first coating processor 8 and the first thermal processor 9.

The SC block 3 is responsible for the process of forming the photoresist film on the substrate W formed with the anti-reflection film. In this preferred embodiment, a chemically amplified resist is used as the photoresist. The SC block 3 comprises a second coating processor 15 for coating with the photoresist film, a second thermal processor 16 for performing a thermal process required for the coating, and a second main transport mechanism 10B for transferring and receiving the substrate W to and from the second coating processor 15 and the second thermal processor 16.

The SD block 4 is a mechanism for developing the substrate W exposed in a predetermined circuit pattern by the exposure apparatus STP. The SD block 4 comprises a development processor 30 for performing a development process using a developing solution, a third thermal processor 31 for performing a thermal process required for the development process, and a third main transport mechanism 10C for transferring and receiving the substrate W to and from the development processor 30 and the third thermal processor 31.

In the above-mentioned BARC, SC and SD blocks 2, 3 and 4, the first coating processor 8, the second coating processor 15 and the development processor 30 (which are collectively referred to as the "chemical processor LP") are positioned on the front side of the apparatus 100, and the first thermal processor 9, the second thermal processor 16 and the third thermal processor 31 (which are collectively referred to as the "thermal processor TP") are positioned on the rear side of the apparatus 100, with the first, second and third main transport mechanisms 10A, 10B and 10C (which are collectively referred to as a "main transport mechanism 10") positioned therebetween. Since the chemical processor LP for performing a process using a predetermined chemical solution in each block and the thermal processor TP for performing a thermal process in each block are spaced apart from each other, with the main transport mechanism 10 lying therebetween, the thermal effect of the thermal processor TP upon the chemical processor LP is suppressed. In the substrate processing apparatus 100 according to the preferred embodiment, a thermal barrier not shown is provided on the front side of the thermal processor TP (or on the main transport mechanism 10 side) to avoid the thermal effect on the chemical processor LP.

Referring to FIG. 2, a plurality of processing units are arranged in stacked relation in each of the first coating processor 8, the second coating processor 15 and the development processor 30 which constitute the chemical processor LP.

The first coating processor 8 includes three first coating processing units 8a to 8c arranged in stacked relation. Each of the first coating processing units 8a to 8c includes a spin chuck 11 for rotating a substrate W while holding the substrate W in a horizontal position under suction, and a nozzle 12 for supplying a coating solution for the anti-reflection film onto the substrate W held on the chuck 11.

Likewise, the second coating processor 15 includes three second coating processing units 15a to 15c arranged in stacked relation. Each of the second coating processing units 15a to 15c includes a spin chuck 17 for rotating a substrate W while holding the substrate W in a horizontal position under suction, and a nozzle 18 for supplying a coating solution for the resist film onto the substrate W held on the chuck 17.

The development processor 30 includes five development processing units 30a to 30e arranged in stacked relation. Each of the development processing units 30a to 30e includes a spin chuck 32 for rotating a substrate W while holding the substrate W in a horizontal position under suction, and a nozzle 33 for supplying the developing solution onto the substrate W held on the chuck 32.

Referring to FIG. 3, a plurality of processing units are arranged in two stacks in each of the first thermal processor 9, the second thermal processor 16 and the third thermal processor 31 which constitute the thermal processor TP.

The processing units in the first thermal processor 9 include a plurality of heating plates HP capable of heating a substrate W to a predetermined temperature and maintaining the substrate W at the predetermined temperature, a plurality of cooling plates CP for cooling a substrate W to a predetermined temperature and maintaining the substrate W at the predetermined temperature, and a plurality of adhesion processing units AHL for thermally processing a substrate W in an atmosphere of HMDS (hexamethyl disilazane) vapor for the purpose of promoting the adhesion of the resist film to the substrate W. These processing units are arranged in stacked relation in predetermined positions. Heater controllers CONT for controlling the components of the first thermal processor 9 are provided under the processing units. The locations indicated by the cross marks (x) in FIG. 3 are occupied by a piping and wiring section or reserved as empty space for future addition of processing units.

Similarly, the processing units in each of the second and third thermal processors 16 and 31 include a plurality of heating plates HP, a plurality of cooling plates CP, and the like. The second and third thermal processors 16 and 31 are similar to the first thermal processor 9 in that the processing units are arranged in two stacks. The third thermal processor 31 further includes substrate rest parts PASS7 and PASS8 to be described later.

Some of the heating plates HP may employ temporary rest-equipped heating plates (not shown) provided in a temporary substrate rest part 19 (See FIG. 1) for temporarily placing a heated substrate thereon. In this case, the heated substrate W is temporarily placed on the temporary substrate rest part 19, and the main transport mechanism 10B or 10C gets access to the temporary substrate rest part 19 to receive the substrate. This is advantageous in minimizing the thermal effect on the main transport mechanisms 10B and 10C because there are no direct transfer of substrates to and from the heating plates HP. The temporary substrate rest part 19 is illustrated in FIG. 1 as provided in each of the second and third thermal processors 16 and 31.

The main transport mechanism 10 (the first to third main transport mechanisms 10A to 10C) will be described. A fourth main transport mechanism 10D provided in the IFB block 5 is similar in construction to the first to third main transport mechanisms 10A to 10C.

The main transport mechanism 10 includes a base 10d, and two (upper and lower) holding arms 10a and 10b (only one of which is shown in FIG. 1) which are provided on the base 10d. Each of the holding arms 10a and 10b has a substantially C-shaped distal end portion, and a plurality of (in FIG. 1, three) pins 10c projecting inwardly of the distal end portion hold a substrate W in a horizontal position. The holding arms 10a and 10b are driven by a driving mechanism not shown to pivot within a horizontal plane, to move vertically along the Z axis and to move back and forth in the direction of the pivot radius.

<IFB Block>

Figure 4:
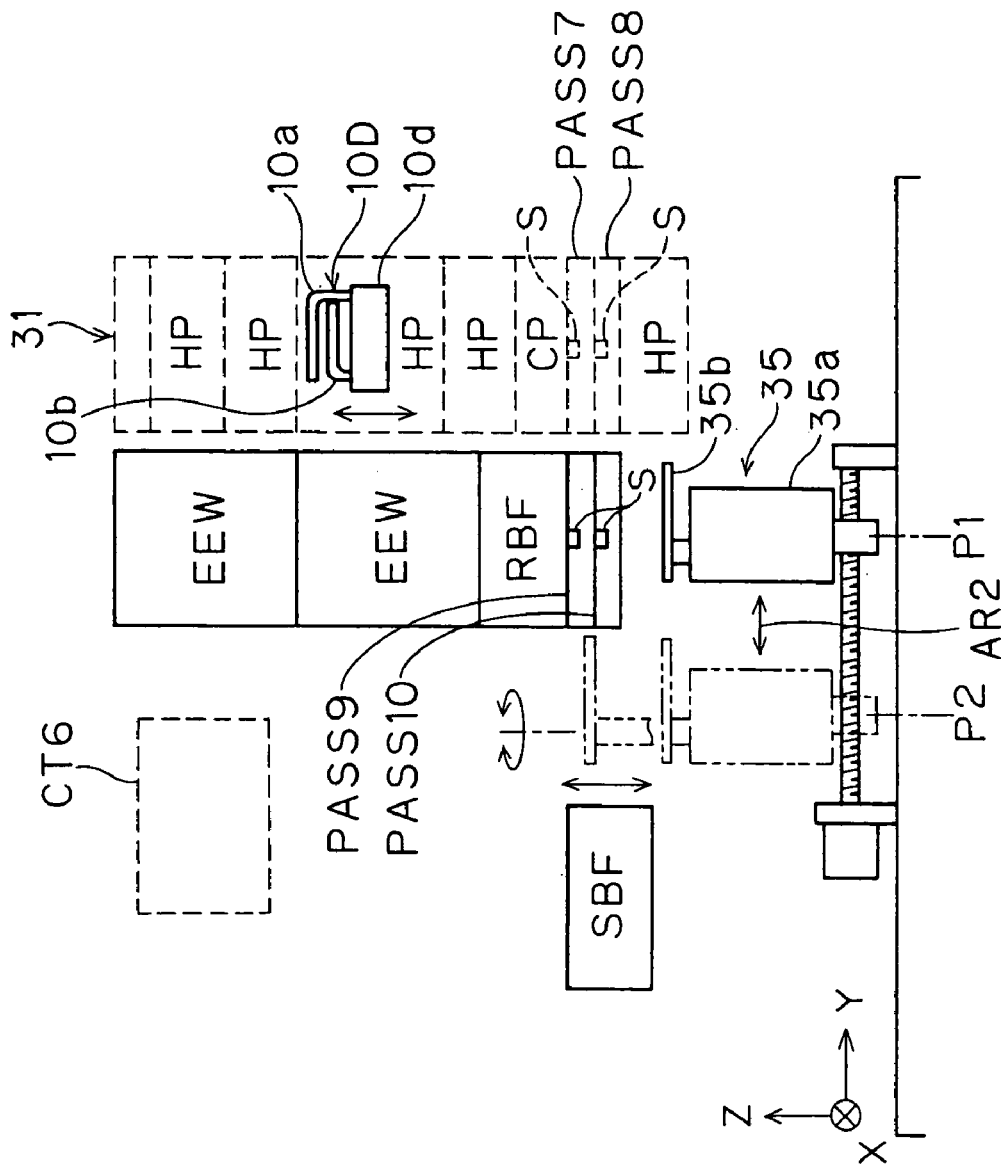
FIG. 4 shows the arrangement of an IFB block with part of a third thermal processor.

The IFB block 5 is responsible for the transfer of substrates W between the substrate processing apparatus 100 and the exposure apparatus STP adjacent thereto. FIG. 4 shows the arrangement of the IFB block 5 with part of the third thermal processor 31 when one side of the substrate processing apparatus 100 is seen from the positive side of the X axis. The IFB block 5 principally comprises: an interface-specific transport mechanism 35 for transferring and receiving a substrate W to and from the exposure apparatus STP; two edge exposure units EEW for previously exposing the periphery of a substrate W coated with the photoresist; a feed buffer SBF for temporarily storing a substrate W if the exposure apparatus STP cannot accept the substrate W; a return buffer RBF for storing an exposed substrate W if a processor in the subsequent stage cannot process the exposed substrate W; substrate rest parts PASS9 and PASS10 (to be described later) for transferring a substrate W between the fourth main transport mechanism 10D and the interface-specific transport mechanism 35; and the fourth main transport mechanism 10D adjacent to the edge exposure units EEW and the heating plates HP provided in the development processing block 4 and for transferring and receiving a substrate W to and from the edge exposure units EEW and the heating plates HP provided in the development processing block 4. The two edge exposure units EEW, the return buffer RBF and the substrate rest parts PASS9 and PASS10 are stacked in the order named, from top to bottom.

Each of the feed buffer SBF and the return buffer RBF includes a cabinet capable of storing a plurality of substrates W in tiers.

As shown in FIG. 2, each of the edge exposure units EEW includes a spin chuck 36 for rotating a substrate W while holding the substrate W in a horizontal position under suction, and a light irradiator 37 for exposing the periphery of the substrate W held on the spin chuck 36 to light. The two edge exposure units EEW are arranged in stacked relation in the center of the IFB block 5.

As shown in FIGS. 1, 2 and 4, the interface-specific transport mechanism 35 includes a movable table 35a horizontally movable (along the Y axis) as indicated by the arrow AR2, and a holding arm 35b provided over the movable table 35a and for holding a substrate W in a horizontal position. The holding arm 35b is driven by a driving mechanism not shown to move vertically, to pivot and to move back and forth in the direction of the pivot radius. The range of horizontal movement of the interface-specific transport mechanism 35 extends to a position P1 under the stacked substrate rest parts PASS9 and PASS10. In the position P1, a substrate W is transferred to and from the exposure apparatus STP. In the opposite position P2 of the range of horizontal movement of the interface-specific transport mechanism 35, a substrate W is transferred to and from the substrate rest parts PASS9 and PASS10 and also is transferred to and from the feed buffer SBF.

<Transfer of Substrates>

Figure 5:
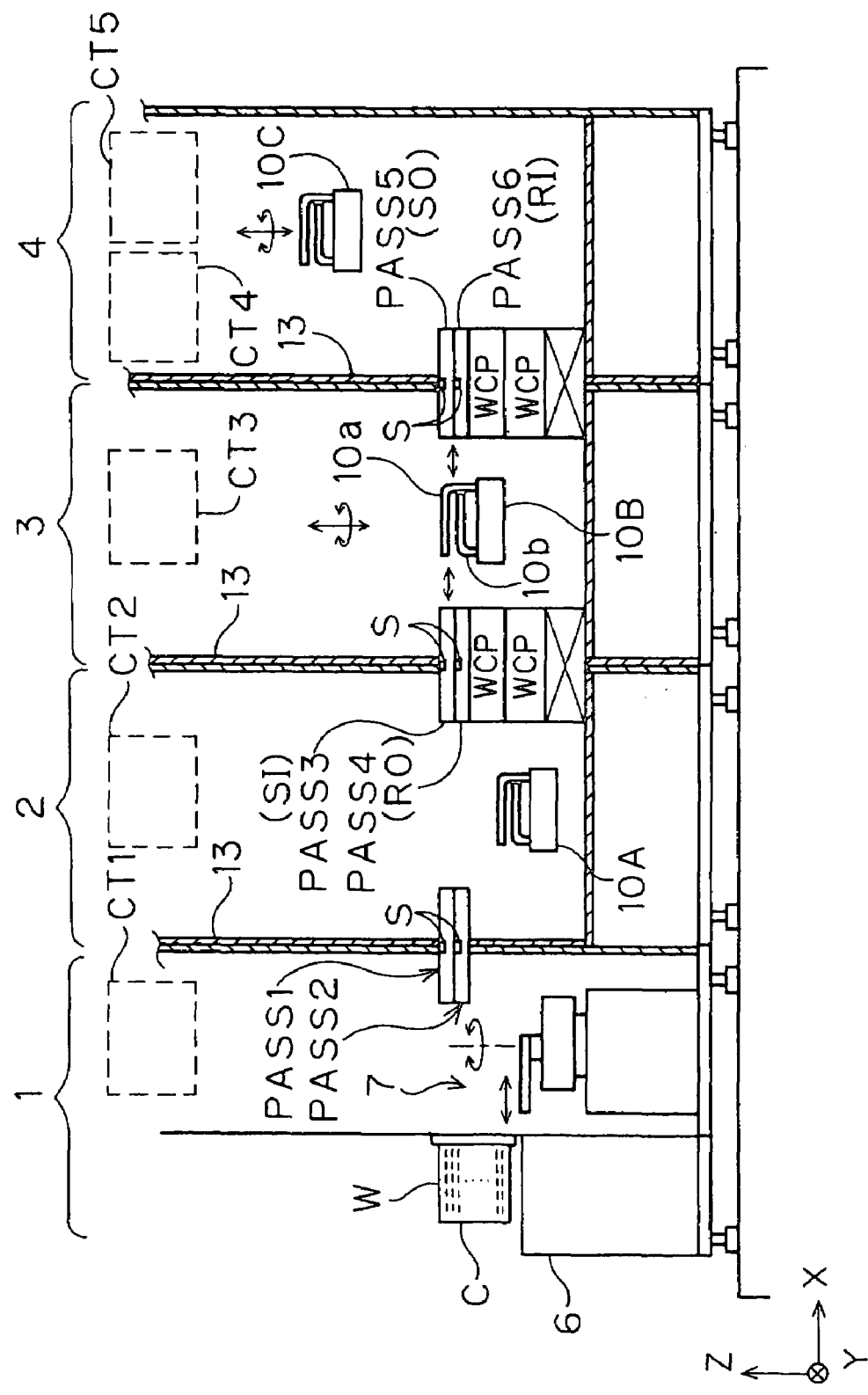
FIG. 5 shows the arrangement of parts associated with the transfer of substrates.

Next, the transfer of substrates W in the substrate processing apparatus 100, mainly between adjacent blocks, will be described. FIG. 5 shows the arrangement of the components of the substrate processing apparatus 100 relating to the transfer of the substrates W, as seen in the same direction as in FIG. 2. As illustrated in FIGS. 1 and 5, the substrate processing apparatus 100 is provided with partitions 13 on the boundaries of adjacent blocks for the purpose of closing off the communication of atmosphere between the blocks. Pairs of vertically arranged substrate rest parts PASS1 to PASS6 for placing a substrate W thereon extend through the respective partitions 13. As shown in FIG. 5, a plurality of cooling plates WCP for roughly cooling a substrate W are provided under the substrate rest parts PASS4 and PASS6.

The upper and lower substrate rest parts PASS1 and PASS2 are provided between the ID block 1 and the BARC block 2. The upper and lower substrate rest parts PASS3 and PASS4 are provided between the BARC block 2 and the SC block 3. The upper and lower substrate rest parts PASS5 and PASS6 are provided between the SC block 3 and the SC block 4.

The substrate rest parts PASS7 and PASS8 for transfer of a substrate W between the SD block 4 and the IFB block 5 are provided in the third thermal processor 31 of the SD block 4 (See FIG. 3). As described above, the substrate rest parts PASS9 and PASS10 are provided in the IFB block 5. These substrate rest parts PASS1 to PASS10 are collectively referred to as a substrate rest part PASS.

Each of the substrate rest parts PASS1 to PASS10 is provided with a plurality of support pins (not shown) capable of supporting a substrate W, and an optical sensor S for detecting whether or not a substrate W is placed on the support pins. The position of the sensor S shown is illustrative and not restrictive.

Of the five pairs of vertically arranged substrate rest parts PASS1 to PASS10, the upper ones are used, in principle, to transfer a substrate W in a direction (referred to as a "feed direction") from the ID block 1 toward the exposure apparatus STP, and the lower ones are used to transfer a substrate W in a direction (referred to as a "return direction") from the exposure apparatus STP toward the ID block 1.

<Cell-by-Cell Control>

The control of operations including the transport of substrates W which is effected in the substrate processing apparatus 100 will be described. Although the substrate processing apparatus 100 comprises the plurality of blocks arranged in adjacent relation, the operation control in the substrate processing apparatus 100 is effected on the basis of component units referred to as "cells."

In principle, each cell comprises: a unit to be controlled which includes at least one processing unit for performing a predetermined process on a substrate W and one transport mechanism for transferring and receiving the substrate W to and from the at least one processing unit; and a cell controller for controlling the unit to be controlled. Each cell transfers and receives substrates to and from an adjacent cell through a feed inlet SI, a feed outlet SO, a return inlet RI and a return outlet RO which will be described later.

Figure 6A:
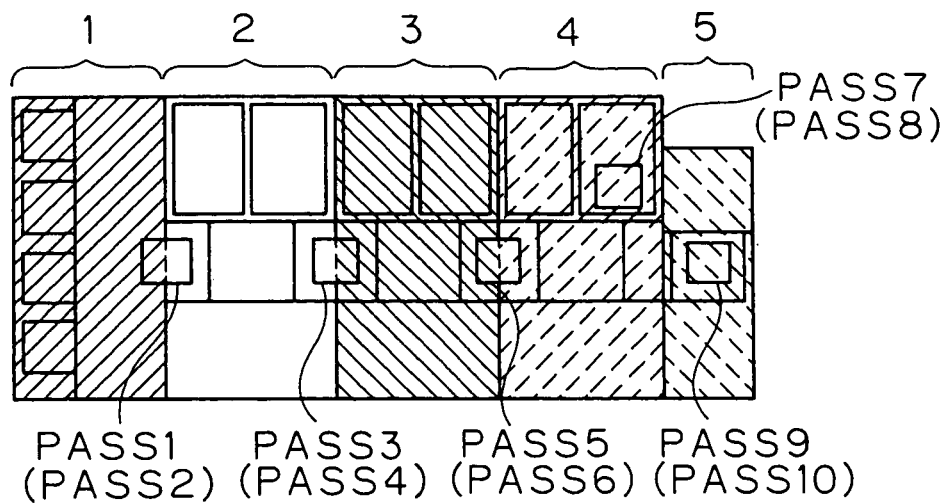
FIGS. 6A and 6B show the construction of blocks and the construction of cells as contrasted with each other.
Figure 6B:
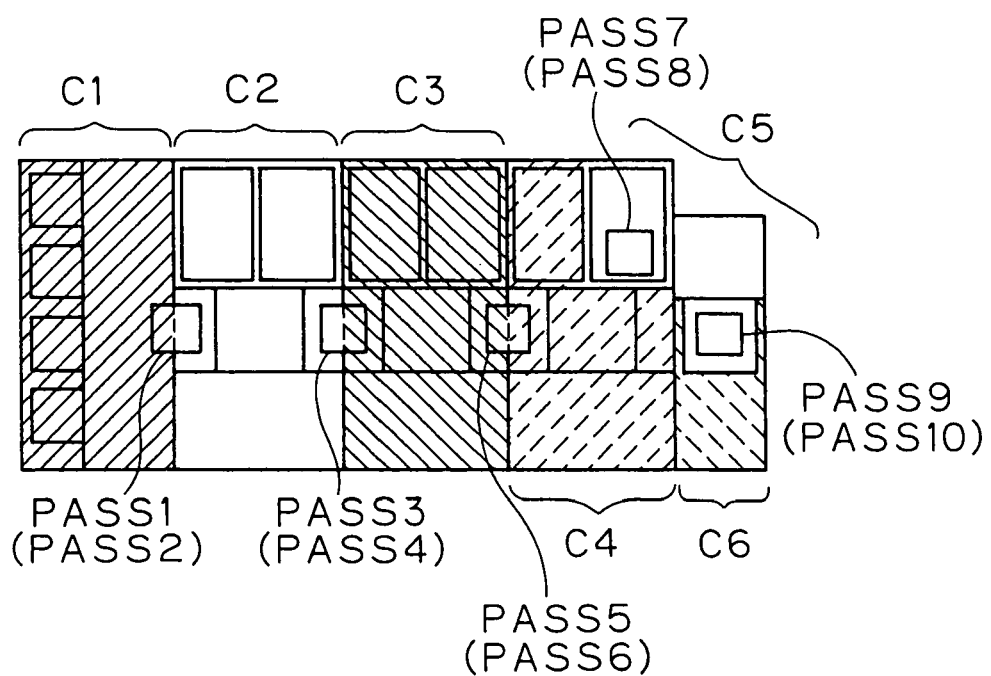

FIGS. 6A and 6B show the construction of the blocks and the construction of the cells as contrasted with each other for the purpose of illustrating the construction of the cells in the substrate processing apparatus 100. As shown in FIG. 6B, the substrate processing apparatus 100 comprises an indexer cell (ID cell) C1, a BARC processing cell (BARC cell) C2, a resist film processing cell (SC cell) C3, a development processing cell (SD cell) C4, a post-exposure thermal processing cell (PEB cell) C5, and an interface cell (IFB cell) C6.

The ID cell C1, the BARC cell C2 and the SC cell C3 include substantially the same components as the ID block 1, the BARC block 2 and the SC block 3, respectively, as illustrated in FIG. 6B.

The SD cell C4 includes all of the component of the SD block 4 except some of the heating plates HP used for post-exposure heating.

The PEB cell C5 includes the heating plates HP in the SD block 4 which are not included in the SD cell C4, the edge exposure units EEW serving as components of the IFB block 5, and the fourth main transport mechanism 10D. The PEB cell C5 straddles the SD block 4 and the IFB block 5, and is a characteristic cell in the substrate processing apparatus 100.

The IFB cell C6 includes all of the components of the IFB block 5 except the edge exposure units EEW and the fourth main transport mechanism 10D.

Cell controllers CT1 to CT6 control the transfer operation of substrates W in the transport mechanisms (the indexer-specific transport mechanism 7, the first to fourth main transport mechanisms 10A to 10D and the interface-specific transport mechanism 35) provided in the cells, respectively. The substrate processing apparatus 100 further comprises a main controller Mc (See FIGS. 2 and 7) for effecting centralized control of the cell controllers CT1 to CT6. The main controller Mc is capable of communication with a host computer not shown for managing the entire semiconductor manufacturing procedure in which the substrate processing apparatus 100 of this preferred embodiment is installed.

The main controller Mc and the cell controllers CT1 to CT6 control the components of the substrate processing apparatus 100, whereby the substrate processing apparatus 100 operates in accordance with previously set recipe data. The recipe data contains descriptions about the designation of the substrate rest parts PASS serving as the inlet and outlet of substrates in each cell, transport setting which is the setting about the transport sequence, timing and the like, and processing condition setting which is the setting about the processing conditions in the respective processing units, all of which are associated with each of the cells. The recipe data is determined for each predetermined substrate unit comprised of a single substrate or a set of substrates to be processed as a unit, e.g. substrates for a single cassette and a predetermined number of substrates. Thus, the substrate processing apparatus 100 may be regarded as an apparatus for performing a predetermined process on a group of substrates whose processing procedure is determined for each substrate unit.

Figure 7:
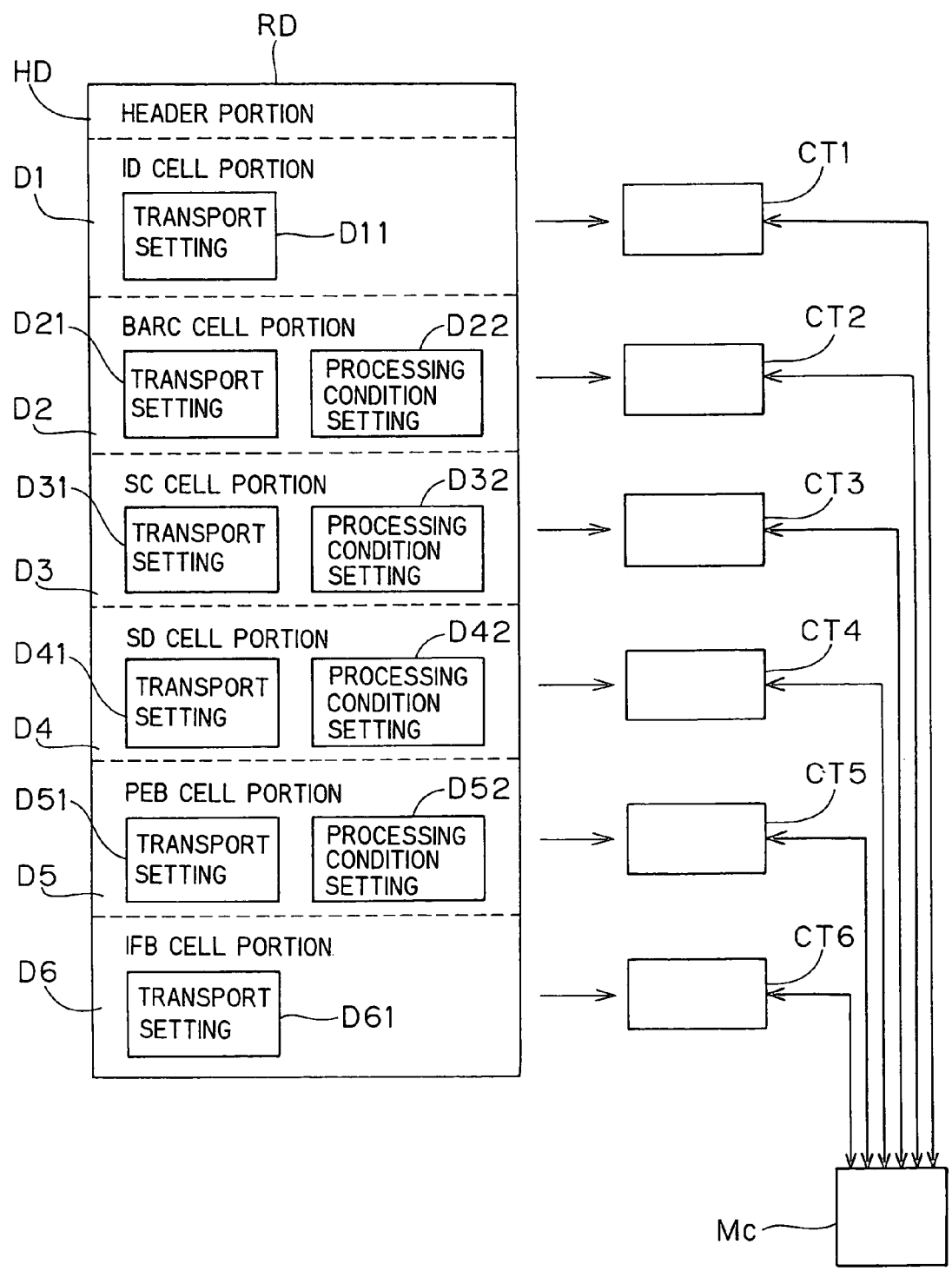
FIG. 7 schematically shows a structure of recipe data.

FIG. 7 schematically shows a structure of an example of the recipe data RD. The recipe data RD includes a header portion HD, an ID cell portion D1, a BARC cell portion D2, an SC cell portion D3, an SD cell portion D4, a PEB cell portion D5, and an IFB cell portion D6. Each of the cell portions D1 to D6 of the recipe data RD contains descriptions about the transport setting D11, D21, D31, D41, D51 or D61 in a corresponding cell, and the processing condition setting D22, D32, D42 or D52 in a corresponding cell including processing units. Each of the cell controllers CT1 to CT6 receives the recipe data RD about a cell portion associated with a corresponding cell to control the operation of the components of the corresponding cell, based on the received data RD. Thus, the operations of the respective cells are performed independently of each other. The structure of the recipe data is not limited to the above-mentioned format.

The current states of substrate processing in the cells are provided through the respective cell controllers CT1 to CT6 to the main controller Mc, and are also transmitted to the host computer. This enables the host computer to easily grasp the states of operation of the respective cells. The arrangement of the cell controllers CT1 to CT6 is shown as an illustrative example in FIGS. 4 and 5. The arrangement of the main controller Mc is shown as an illustrative example in FIG. 2. However, the arrangements of the cell controllers CT1 to CT6 and the main controller Mc are not limited to those shown.

<Transport Operation in Cells>

Because of the cell-by-cell control, the substrate processing apparatus 100 may be considered to comprise the six independently operating cells arranged in adjacent relation and to transfer substrates between the cells by way of the substrate rest parts PASS1 to PASS10.

The transport operation in the cells, i.e. the transfer of a substrate between adjacent cells and within each cell, will be described by taking the SC cell C3 as an example (See FIG. 10).

The substrate rest part PASS3 serves as the inlet of the SC cell C3 for receiving a substrate W transported from the BARC cell C2 in the feed direction. The substrate rest part PASS serving as an inlet of each cell for a substrate W transported in the feed direction is referred to hereinafter as the "feed inlet" SI. Similarly, the substrate rest part PASS serving as an outlet of each cell for a substrate W transported in the feed direction is referred to hereinafter as the "feed outlet" SO. The substrate rest parts PASS serving as an inlet and an outlet of each cell for substrates W transported in the return direction are referred to hereinafter as the "return inlet" RI and the "return outlet" RO, respectively. The substrate rest parts PASS5, PASS6 and PASS4 correspond to the feed outlet SO, the return inlet RI and the return outlet RO, respectively, of the SC cell C3.

When the first main transport mechanism 10A provided in the BARC cell C2 places an unprocessed substrate (a first substrate) W on the substrate rest part PASS3 serving as the feed inlet SI of the SC cell C3, the optical sensor S provided in the substrate rest part PASS3 detects the unprocessed substrate W. The cell controller CT3 responsible for the control of the SC cell C3 controls the second main transport mechanism 10B provided in the SC cell C3 in response to a placement state signal emitted at this time to receive the first substrate W placed on the substrate rest part PASS3 in predetermined timed relation. In this process, if the second main transport mechanism 10B holds a second substrate W to be returned to the BARC cell C2 by way of the substrate rest part PASS4 corresponding to the return outlet RO, the cell controller CT3 also causes the second main transport mechanism 10B to transfer the second substrate W to the BARC cell C2.

To transfer the substrates W, the second main transport mechanism 10B vertically move and pivot the holding arms 10a and 10b integrally to a position opposed to the substrate rest parts PASS3 and PASS4. Then, the second main transport mechanism 10B places the second substrate W processed and held on the holding arm 10b onto the substrate rest part PASS4 serving as the return outlet RO. Thereafter, the second main transport mechanism 10B drives the emptied holding arm 10b again to receive the first substrate W from the substrate rest part PASS3 serving as the feed inlet SI onto the holding arm 10b. Thus, the second main transport mechanism 10B uses only the holding arm 10b to perform the transfer operation of the substrates W.

This transfer operation makes the substrate rest part PASS3 empty, and causes the substrate rest part PASS4 to hold the second substrate thereon. The optical sensors S provided in the substrate rest parts PASS3 and PASS4 detect the respective states thereof, i.e., the absence and presence of the substrates, and transmit signals indicating the respective states to the cell controller CT2 of the BARC cell C2. In response to the signals, the BARC cell C2 is allowed to transfer the subsequent substrate W.

After the transfer of the substrates W from and to the substrate rest parts PASS3 and PASS4, the second main transport mechanism 10B transports the received first substrate W, in principle, to a predetermined processing unit in accordance with the control of the cell controller CT3 based on the settings in the recipe data RD. Specifically, the destination to which the first substrate W is transported in the SC cell C3 is one of the cooling plates CP, the heating plates HP and the second coating processing units 15a to 15c. The second main transport mechanism 10B vertically moves and pivots the empty holding arm 10a holding no substrate W and the holding arm 10b holding the first substrate W integrally to a position opposed to the destination processing unit. In general, a preceding substrate (a third substrate) W being processed is present in the destination processing unit. The second main transport mechanism 10B moves the empty holding arm 10a forward to receive the third substrate W processed in the destination processing unit, and subsequently moves the holding arm 10b holding the first substrate W forward to place the first substrate W in a predetermined position of the destination processing unit.

Subsequently, the second main transport mechanism 10B similarly transfers substrates to and from a predetermined processing unit by means of the holding arms 10a and 10b in accordance with the control of the cell controller CT3 based on the recipe data RD. That is, the second main transport mechanism 10B receives a substrate W processed in the processing unit onto one of the holding arm holding no substrate W, and in turn places another substrate W held by the other holding arm into a predetermined position of the processing unit. It should be noted that the second main transport mechanism 10B is controlled to use only one of the holding arms 10a and 10b when receiving a substrate W heated by any heating plate HP. This suppresses the thermal effect of the holding arms 10a and 10b upon the substrate W, and minimizes the variations of the thermal effect.

The substrate W transferred sequentially to several processing units and subjected to predetermined processes determined in the recipe data RD in this manner is placed on the substrate rest part PASS5 corresponding to the feed outlet SO so as to be transferred from the SC cell C3 to the SD cell C4. The procedure in this process is similar to that performed when the substrate W is transferred from the BARC cell C2 to the SC cell C3. The second main transport mechanism 10B principally performs the operation similar to that described above when returning a substrate W subjected to the predetermined process in the cell by way of the substrate rest part PASS4 corresponding to the return outlet RO to the BARC cell C2 without processing in the subsequent cell or when transferring a received substrate W immediately to the SD cell 4 without processing in the processing units, depending on the settings of the recipe data RD. When returning a substrate W to the ID cell C1 in the return direction after the process such as exposure, the second main transport mechanism 10B receives the substrate W from the substrate rest part PASS6 corresponding to the return inlet RI to transfer the substrate W directly to the substrate rest part PASS4 corresponding to the return outlet RO in predetermined timed relation, in which case the transfer operation as described above is carried out.

In the SC cell C3, as discussed above, the cell controller CT3 controls the operations of the second main transport mechanism 10B and the processing units in accordance with the settings in the recipe data RD. The processing in the cell is performed independently of its adjacent cells except that the operation is performed in response to the predetermined signal indicating that a substrate W is placed on the feed inlet SI or the return inlet RI.

The same holds true for other cells although different processing is performed. Specifically, the cell controllers CT1 to CT6 independently perform a series of control operations of receiving a substrate W placed on the corresponding feed inlet SI or return inlet RI, transporting the substrate W sequentially to predetermined processing units and finally placing the substrate W subjected to the predetermined processes onto the corresponding feed outlet SO or return outlet RO. This is accomplished by defining the recipe data RD on the cell-by-cell basis with regard to where to transport the substrate W received from the processing unit or the substrate rest part PASS by the transport mechanism, which timing and which priority are to be selected during the above-mentioned transport, and which conditions are to be selected to process the substrate W in each processing unit.

This means that the transport and processing in each cell are performed independently for each cell based on the recipe data and, as a result, the entire processing is accomplished in the substrate processing apparatus 100. Since the transfer of substrates W between adjacent cells is not directly controlled except that reference is made to whether or not substrates W are placed on at the most four substrate rest parts PASS serving as the substrate inlets and outlets of the entire apparatus 100, the influence of the operation in one cell upon other cells is reduced. Therefore, the control of the entire apparatus is simplified, and easy and flexible operation setting in the recipe data RD is permitted.

Each of the cell controllers CT1 to CT6 controls only the transfer of substrates W using the transport mechanism in the corresponding cell and the operation of the processing units included in the corresponding cell. There is no need to consider the details of operations in adjacent cells. This requires a relatively light burdens of control on the cell controllers CT1 to CT6 to facilitate the overall control as compared with the conventional control methods which control the entire transport operations in a collective manner.

In the conventional control methods, a need arises to significantly correct a control program if a new processing unit or the like is added. According to the present invention, however, the addition of a new cell creates only a need to add the recipe data RD about the added cell, but does not influence the details of control of the existing adjacent cells. Therefore, the present invention achieves the easy and flexible addition of cells. An example is to add between the SC cell C3 and the SD cell C4 a cell including an inspection processing unit for inspecting a resist film thickness and a line width and a transport mechanism for transporting substrates in the cell.

<Double-Flow Processing>

In the substrate processing apparatus 100, as described above, the cell controllers CT1 to CT6 independently control the transport operations in the respective cells so as to repeat the procedure of transporting a substrate W present in a first given position (a substrate rest part or a processing unit) to a second predetermined position (a substrate rest part or a processing unit), independently of which flow contains each transport operation. Thus, the transport of a substrate W from a first position to any one of a plurality of second positions is allowed if the destination can accept the substrate W, depending on how the recipe data RD is defined. This consequently corresponds to the execution of so-called double-flow processing in which a plurality of process flows having different transport paths are processed in parallel.

Figure 8:
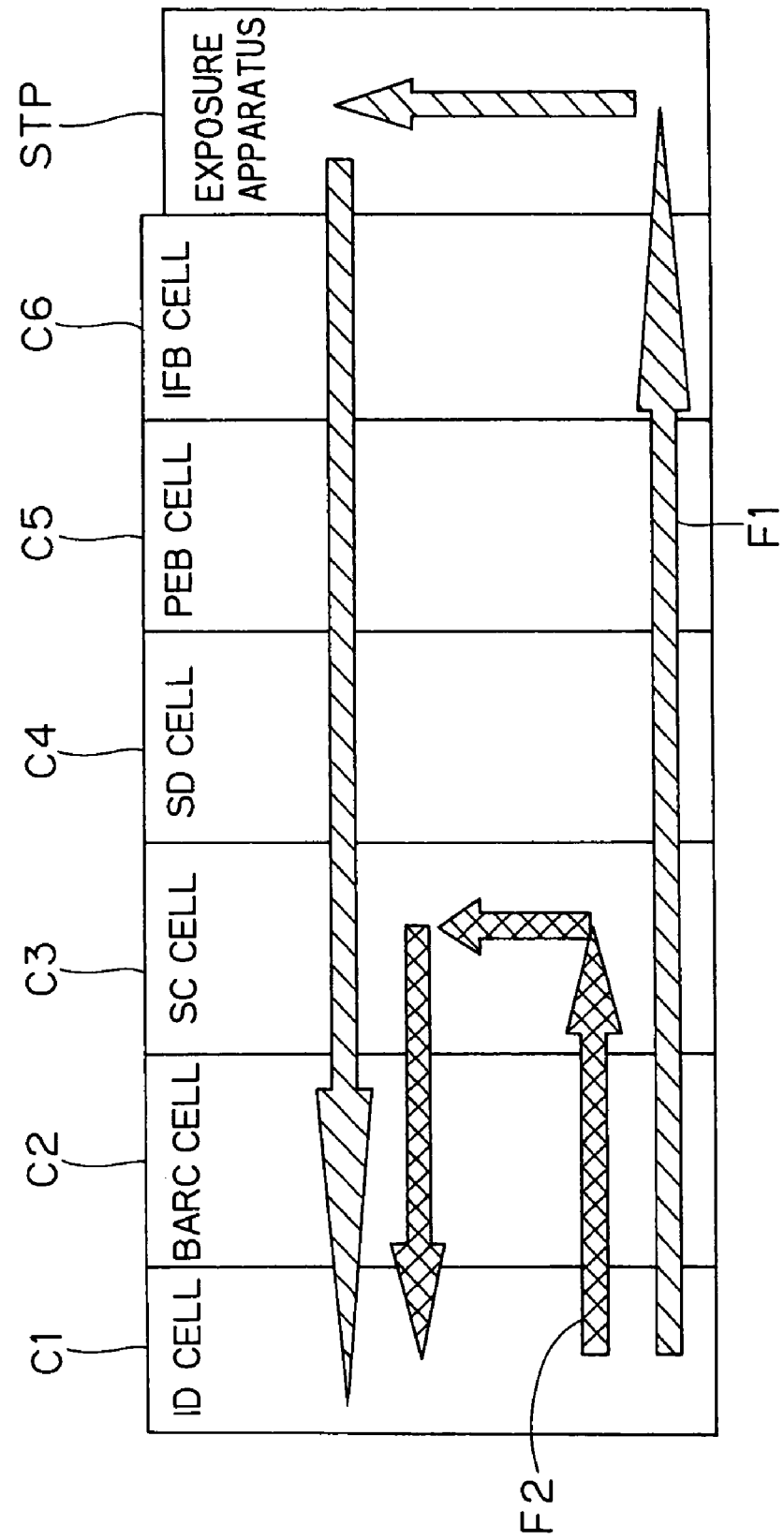
FIG. 8 schematically shows an example of double-flow processing.
Figure 9:
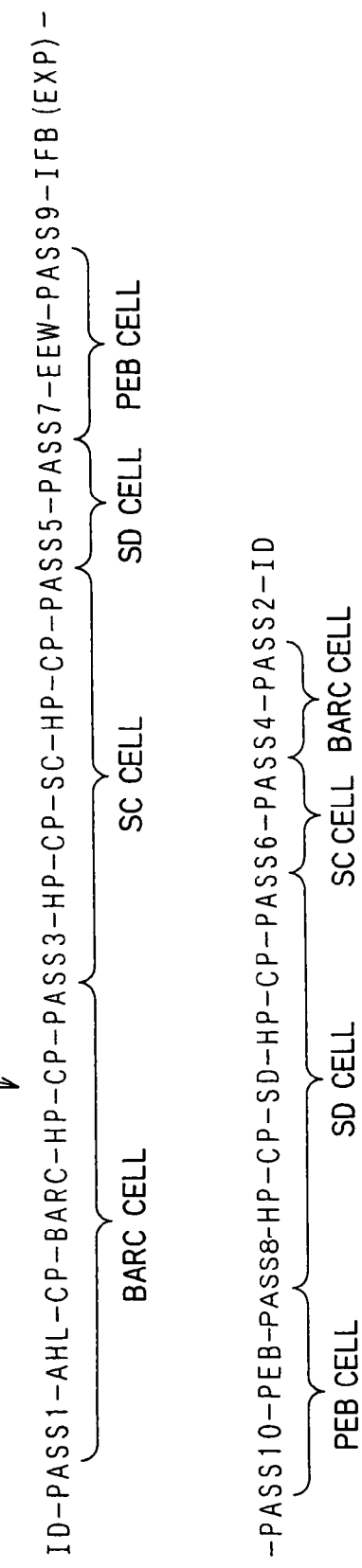
FIGS. 9A, 9B and 9C show transport paths in a main flow and sub-flows in an illustrative manner.

FIG. 8 conceptually shows an example of the double-flow processing in the substrate processing apparatus 100. FIGS. 9A to 9C show transport paths in a main flow F1 and sub-flows F2 and F3 implemented by determining the transport setting for each of the substrate units in an illustrative manner. In other words, FIGS. 9A to 9C correspond to specific examples of FIG. 8. FIG. 9A shows an example of the transport path in the main flow F1, and FIGS. 9B and 9C show examples of the transport paths in the sub-flows F2 and F3, respectively.

The main flow F1 (a flow containing the exposure apparatus STP) shown in FIGS. 8 and 9A is a process flow for sequentially performing the anti-reflection film formation in the BARC cell C2, the resist film formation in the SC cell C3, the edge exposure process in the PEB cell C5, the exposure process in the exposure apparatus STP and the development process in the SD cell C4, that is, a series of processes (including associated thermal processes) to be performed in the substrate processing apparatus 100 upon a substrate W received in the ID cell C1 from the outside, to transfer the substrate W to the outside. The sub-flow F2 (a flow not containing the exposure apparatus STP) is a process flow for performing only the resist film formation in the SC cell C3.

As an example, it is assumed that a first set of substrates W to be processed in the main flow F1 are sequentially received from any cassette C provided in the ID cell C1 and transferred to the subsequent stage, and thereafter a second set of substrates W to be processed in the sub-flow F2 are received from a different cassette C and transferred to the subsequent stage. Then, the first and second sets of substrates W stored in the respective cassettes C correspond to a substrate unit to be processed (a substrate or a set of substrates to be processed as a unit) in the main flow F1 and a substrate unit to be processed in the sub-flow F2, respectively. The transport path of a substrate W is determined in the SC cell C3, based on information about which set the substrate W belongs to. This consequently means branching into two process flows in the SC cell C3.

Figure 10:
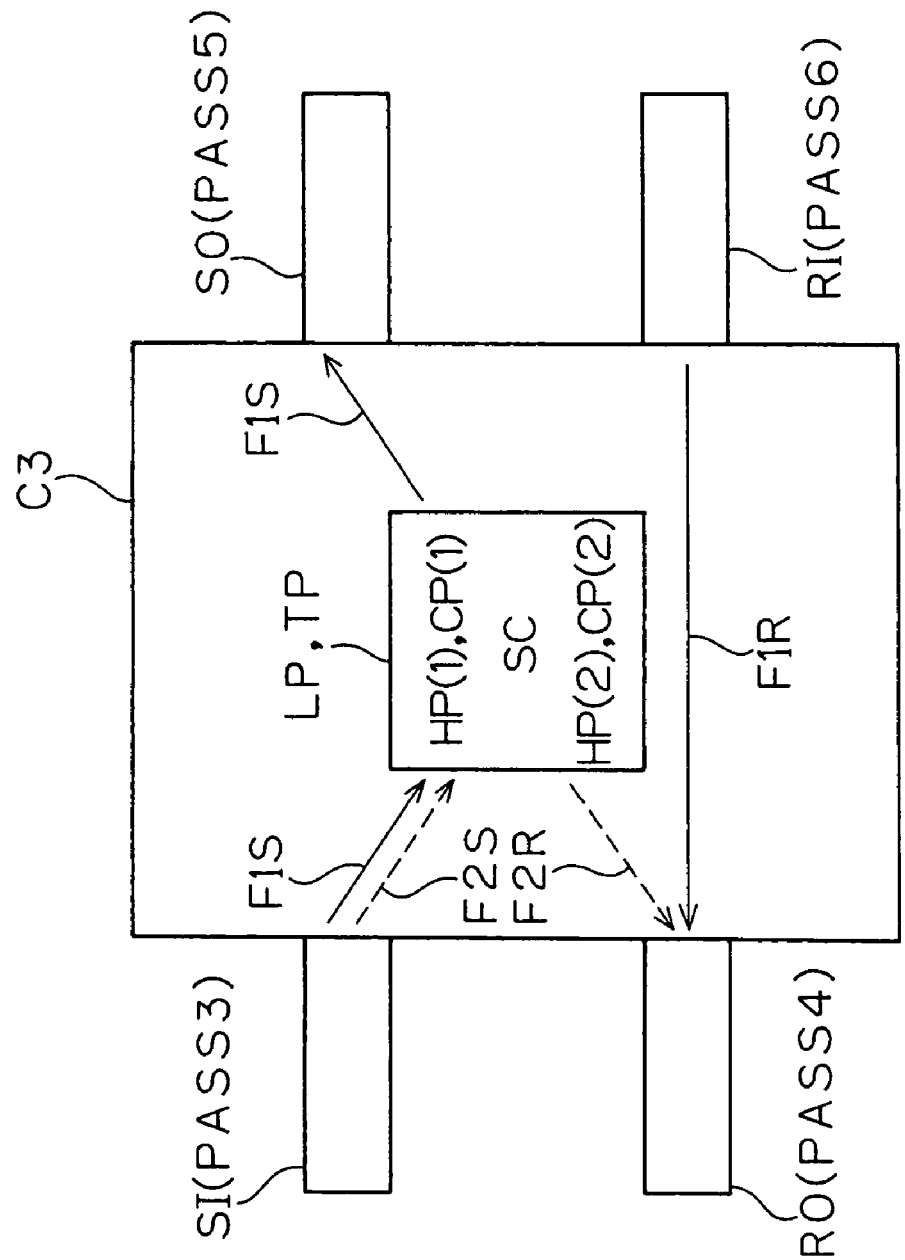
FIG. 10 illustrates the transport paths in the main flow and one of the sub-flows in an SC cell.

FIG. 10 illustrates the transport paths in the main flow F1 and the sub-flow F2 in the SC cell C3 in this case.

In the main flow F1, a substrate W placed on the substrate rest part PASS3 corresponding to the feed inlet SI is transported to a predetermined processing unit in the chemical processor LP or the thermal processor TP, as indicated by a partial flow F1S. After the processing, the substrate W is transferred to the substrate rest part PASS5 corresponding to the feed outlet SO. A substrate W placed on the substrate rest part PASS6 corresponding to the return inlet RI after the exposure and development is directly transferred to the substrate rest part PASS4 corresponding to the return outlet RO, as indicated by a partial flow F1R.

The sub-flow F2, on the other hand, is similar to the main flow F1 until a substrate W placed on the feed inlet SI is transported to a predetermined processing unit in the chemical processor LP or the thermal processor TP and subjected to a predetermined process therein, as indicated by a partial flow F2S. After the processing, however, the substrate W is directly transported to the return outlet RO, as indicated by a partial flow F2R.

It will be understood from the above that the main flow F1 contains more process steps subsequent to the SC cell C3 than the sub-flow F2, resulting in a situation in which the substrate W supplied for the sub-flow F2 gets ahead of the substrate W yet to be subjected to the processes subsequent to the SC cell C3 in the main flow F1. This means that the processes in the sub-flow F2 can be completed before the completion of all of the processes in the main flow F1 or that the processes in the two process flows are present. This corresponds to the double-flow processing in which substrates W are processed in different process flows in parallel. The double-flow processing improves throughput over the sequential processing of the process flows.

Figure 11:
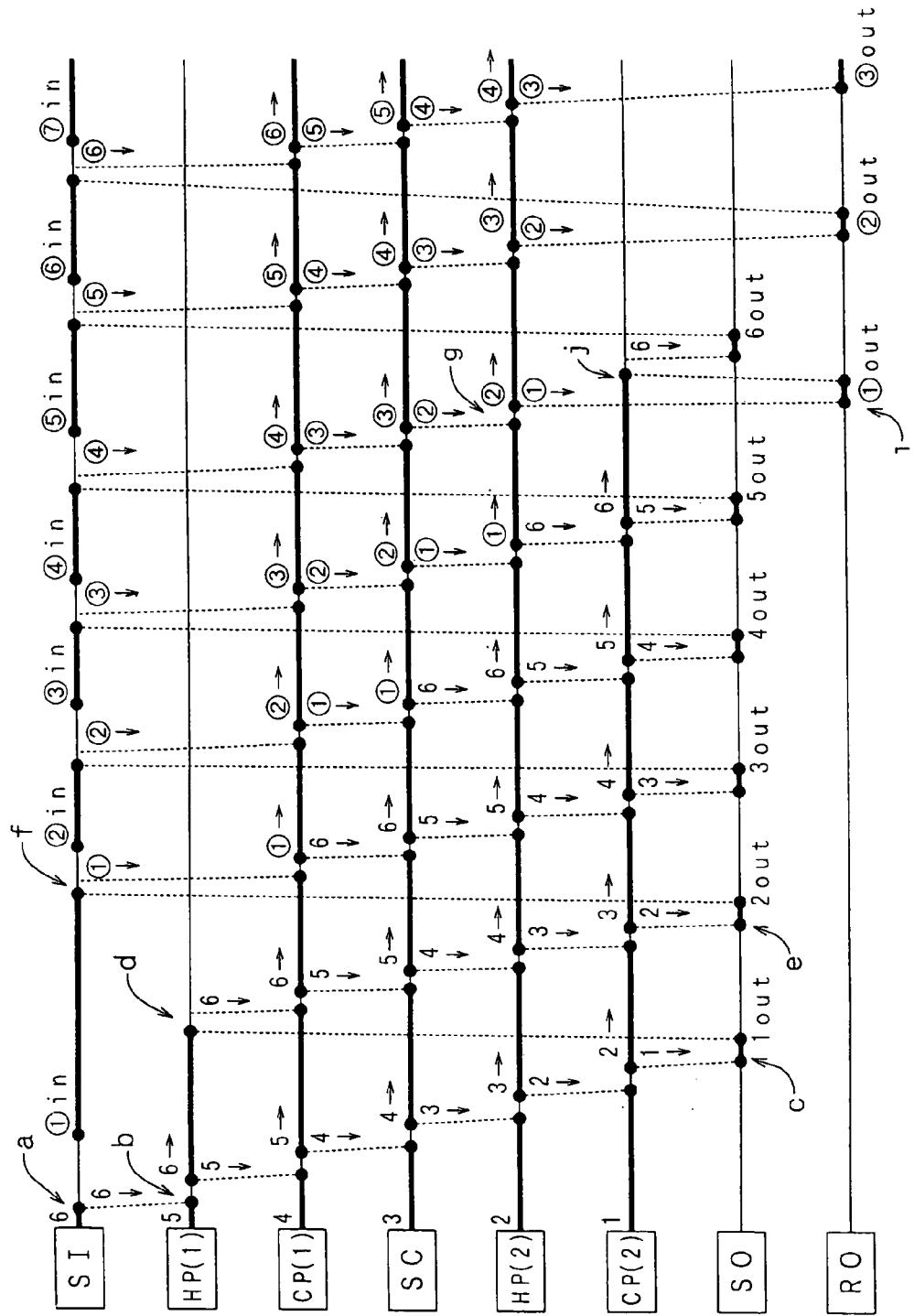
FIG. 11 shows a relationship between the operation of a second main transport mechanism, transport situations of substrates, and processing situations in respective processing units in the SC cell when implementing the double-flow processing.

FIG. 11 shows a relationship between the operation of the second main transport mechanism 10B, the transport situations of substrates W and the processing situations in the respective processing units in the SC cell C3 when implementing the double-flow processing in the main flow F1 and the sub-flow F2. For ease of discussion, it is assumed in the SC cell C3 that only one second coating processing unit SC (e.g. the second coating processing unit 15a shown in FIG. 2) is used in either of the main flow F1 and the sub-flow F2 in the SC cell C3, that two heating plates and two cooling plates are used in the main flow F1, and that one heating plate and one cooling plate are used in the sub-flow F2. In FIG. 11, the passage of time is shown from left to right, and the horizontal lines indicate the states of the respective components (the processing units, the inlet and the outlets). The return inlet RI is not shown in FIG. 11. That is, a situation in which no substrates have been returned from the return inlet RI yet will be described. Dotted lines in FIG. 11 indicate the movement of the second main transport mechanism 10B. Heavy line segments for the respective components indicate that substrates, are present (being processed or on standby) therein. Numerals appended to the respective heavy line segments designate substrate numbers for identification of individual substrates W. The bare numerals "1, 2, . . . , 6" denote the substrates W processed in the main flow F1, and the circled numerals denote the substrates W processed in the sub-flow F2. The smaller the numerals are, the earlier the substrates are accepted in the SC cell C3.

At the time indicated by the arrow a, substrates Nos. 1 to 5 to be processed in the main flow F1 are being processed in the processing units or on standby in the SC cell C3, and a substrate No. 6 is about to be received from the feed inlet SI by the second main transport mechanism 10B. It is now assumed that the substrate No.6 is the last substrate in a substrate unit to be processed in the main flow F1. The second main transport mechanism 10B transports the substrate No. 6 to a heating plate HP(1) which is the first destination previously determined as the transport setting in the SC cell C3 for the main flow F1. At the time indicated by the arrow b at which the second main transport mechanism 10B reaches the heating plate HP(1), the second main transport mechanism 10B receives the substrate No. 5 having been processed by the heating plate HP(1), and in turn transfers the transported substrate No. 6 to the heating plate HP(1). Next, the second main transport mechanism 10B transports the received substrate No. 5 to the cooling plate CP(1) to replace the substrate No. 4 with the substrate No. 5. Such transport and replacement are repeated until the substrate No. 1 transported from the cooling plate CP(2) is transported to the feed outlet SO and transferred outwardly of the SC cell C3 at the time indicated by the arrow c. The substrate No. 1 transferred outwardly of the SC cell C3 is received by the third main transport mechanism 10C in the SD cell C4 in timed relation.

The second main transport mechanism 10B having transferred the substrate W to the feed outlet SO returns to the heating plate HP(1) while holding no substrate W, and receives the substrate No. 6 transferred to the heating plate HP(1) previously at the time indicated by the arrow b. Then, the second main transport mechanism 10B transports the substrate No. 6 to the cooling plate CP(1). Subsequently, the second main transport mechanism 10B repeats the process of transporting a substrate W to a processing unit and replacing another substrate. Then, the substrate No. 2 is transferred outwardly from the feed outlet SO at the time indicated by the arrow e.

The second main transport mechanism 10B holding no substrate W again moves to the feed inlet SI. The substrate No. ① to be processed in the sub-flow F2 is placed on the feed inlet SI by the first main transport mechanism 10A in the BARC cell C2. Upon receipt of the substrate No. ①, the second main transport mechanism 10B transports and transfers the substrate No. ① to the cooling plate CP(1) which is the first destination previously determined as the transport setting in the SC cell C3 for the sub-flow F2. This starts the processing in the SC cell C3 in the sub-flow F2. At this time, the substrate to be processed in the sub-flow F2 is accepted into the SC cell C3 before the completion of the process of the preceding substrate to be processed in the main flow F1 which is accepted earlier into the SC cell C3. The substrate No. 6 is transferred outwardly of the cooling plate CP(1) which in turn receives the substrate No. ①. Subsequently, substrates to be processed in the respective flows are processed in accordance with the transport setting determined in corresponding relation to the respective flows while the substrates to be processed in different flows are present in the SC cell C3. Because the cell controller CT3 of the SC cell C3 transports and processes the individual substrates in accordance with the transport setting corresponding to the respective substrates (or the respective substrate units to be processed) as described above, the presence of the substrates different in transport setting is allowed.

Since the substrate No. ① is already placed on the feed inlet SI at the time indicated by the arrow d, the second main transport mechanism 10B may be configured to move to receive the substrate No. ① earlier, depending on the previously determined priorities. In this case, a resultant situation is slightly different, which, however, is not immaterial in the present invention, but similar effects are produced.

After the time indicated by the arrow f, the transport and the transfer are subsequently repeated to transfer the substrates Nos. 3, 4 and 5 outwardly and to accept the substrates Nos. ②, ③ and ④. Then, at the time indicated by the arrow g, the second main transport mechanism 10B receives the substrate No. ① from a heating plate HP(2). The substrate No. ① in the sub-flow F2 has been subjected to all processes to be performed in the SC cell C3 at this time, and therefore is ready for outward transfer from the SC cell C3 earlier. Thus, the substrate No. ① received by the second main transport mechanism 10B is transported to the return outlet RO, and is transferred outwardly to the return outlet RO at the time indicated by the arrow i. At this time, the substrate No. 6 which is still present in the cooling plate CP(2) is not yet allowed to be transferred outwardly. Additionally, the substrates Nos. 1 to 5 being processed in the main flow F1 have not yet returned to the SC cell C3. Thus, the substrate No. ① processed in the sub-flow F2 gets ahead of these substrates Nos. 1 to 6 in the main flow F1 which are processed earlier in the SC cell C3, and is transferred to the BARC cell C2 earlier. From the viewpoint of the transfer of substrates, the double-flow condition in which two different process flows are present in parallel is accomplished.

After the substrate No. ① is transferred outwardly, the substrates Nos. 6, ②, ③, . . . are sequentially transferred outwardly. Although not shown, the substrates Nos. 1 to 6 will return from the return inlet RI to the SC cell C3. If any substrate W being processed in the sub-flow F2 still remains in the SC cell C3, the substrates in both of the process flows are processed while being present in the SC cell C3.

In the substrate processing apparatus 100 according to the preferred embodiment as described above, the transport setting for each cell is determined for each substrate unit to be processed, and the cell controller transports the individual substrates, based on the transport setting. Thus, each cell can process substrates if the substrates correspond to different transport settings. This accomplishes the double-flow processing in which the substrates belonging to different process flows are processed while being present in the same cell by the use of a simple control algorithm established on the cell-by-cell basis, thereby to improve the throughput of the substrate processing apparatus 100.

In the above example with reference to FIGS. 10 and 11, the SC cell C3 employs the one second coating processing unit SC (e.g. the second coating processing unit 15a of FIG. 2) in either of the main flow F1 and the sub-flow F2, the two heating plates HP(1) and HP(2) and the two cooling plates CP(1) and CP(2) in the main flow F1, and the one heating plate HP(2) and the one cooling plate CP(1) in the sub-flow F2.

In the sub-flow F2, a different processing unit than those used in the main flow F1 may be used. Specifically, the second coating processing unit 15b, a heating plate HP(3) and a cooling plate CP(3) may be used in the sub-flow F2 which are different from the second coating processing unit 15a, the heating plates HP(1), HP(2), and the cooling plates CP(1), CP(2) used in the main flow F1.

The difference in processing units to be used between the main flow F1 and the sub-flow F2 is advantageous in avoiding the problem of a conflict between the main flow F1 and the sub-flow F2, e.g. a competition for the use of a processing unit between the main flow F1 and the sub-flow F2, and the placement of a substrate on a processing unit occupied by another substrate.

In the light of this advantage, the double-flow processing may be inhibited to avoid the conflict between the main flow F1 and the sub-flow F2 if there is a processing unit the use of which is shared between the main flow F1 and the sub-flow F2. Specifically, the main controller Mc and the cell controllers CT1 to CT6 may be controlled to process the substrates in the sub-flow F2 only after the substrates in the main flow F1 starting from the ID block 1 and passing through the exposure apparatus STP return to the ID block 1 again.

Such inhibition of the double-flow processing, however, reduces the throughput as a matter of course.

A method which can circumvent the need to inhibit the double-flow processing even when there is a processing unit the use of which is shared between the main flow and the sub-flow will be contemplated.

There is a likelihood that the conflict occurs between the main flow F1 and the sub-flow F2 in the double-flow processing, for example, when the SC cell C3 of FIG. 8 includes a processing unit the use of which is shared between the return flow to the ID cell C1 in the main flow F1 and the return flow to the ID cell C1 in the sub-flow F2. This is because when the substrates in the main flow F1 return from the SD cell C4 to the SC cell C3 is uncertain and because there is a likelihood that a substrate is placed on a second substrate in a common processing unit (e.g., the cooling plate CP(1)) in the SC cell C3 if the second substrate in the sub-flow F2 is being processed in the common processing unit.

There is, on the other hand, no likelihood that the conflict occurs between the main flow F1 and the sub-flow F2 in the double-flow processing when the SC cell C3 of FIG. 8 includes a processing unit the use of which is shared between the feed flow from the ID cell C1 in the main flow F1 and the feed flow from the ID cell C1 in the sub-flow F2. This is because the control of the substrate processing order between the main flow F1 and the sub-flow F2 is ensured by introducing the substrates in the sub-flow F2 into the SC cell C3 after the substrates in the main flow F1 are introduced into the SC cell C3 as shown in FIG. 11, to avoid the subsequent conflict between the main flow F1 and the sub-flow F2, unlike the above-mentioned case in which there is a common processing unit the use of which is shared between the return flows.

Thus, when the substrates to be processed in the main flow F1 and the substrates to be processed in the sub-flow F2 are received from the same feed inlet SI and subjected to intra-cell processing in the common processing unit in the SC cell C3 as shown in FIG. 10, the main controller Mc and the cell controller CT3 under the control of the main controller Mc should allow the second main transport mechanism 10B to outwardly transfer a substrate in the sub-flow F2 which is made ready for outward transfer earlier (as indicated by F2R), and to receive another substrate in the sub-flow F2 (as indicated by F2S) before the completion of the intra-cell processing of the preceding substrates in the main flow F1.

This means that the outward transfer (as indicated by F2R) and the receipt (as indicated by F2S) are allowed when the substrate transport path for each substrate unit to be processed branches into the main flow and the sub-flow and a processing unit the use of which is shared between the main flow and the sub-flow is contained in the feed flows in the main flow and sub-flow.

If there is a processing unit the use of which is shared between the main flow and the sub-flow, the double-flow processing may be inhibited to avoid the conflict between the main flow and the sub-flow, in which case, however, the throughput is reduced as described above. If the common processing unit is contained in the feed flows in the main flow and sub-flow, the control of the substrate processing order in the feed flows in the main flow and sub-flow prevents the subsequent conflict between the main flow and the sub-flow. Thus, the throughput is improved without the occurrence of the conflict between the main flow and the sub-flow in the double-flow processing.

Although the SC cell C3 is taken as an example in the above description, other cells may be, of course, controlled to allow the double-flow processing only when the common processing unit is contained in the feed flows. In this case, the above-mentioned effects are also produced.

More generally, the expression "when the common processing unit is contained in the feed flows" corresponds to "when the common processing unit is present in a flow (branching flow) in the direction of branching into a plurality of transport paths." The expression "when the common processing unit is contained in the return flows" corresponds to "when the common processing unit is present in a flow (merging flow) in the direction in which a plurality of transport paths merge together." Only for the branching flow, the control should be effected to allow the presence of different flows, i.e. the main flow and the sub-flow, in the common processing unit.

<Modifications>

Figure 12:
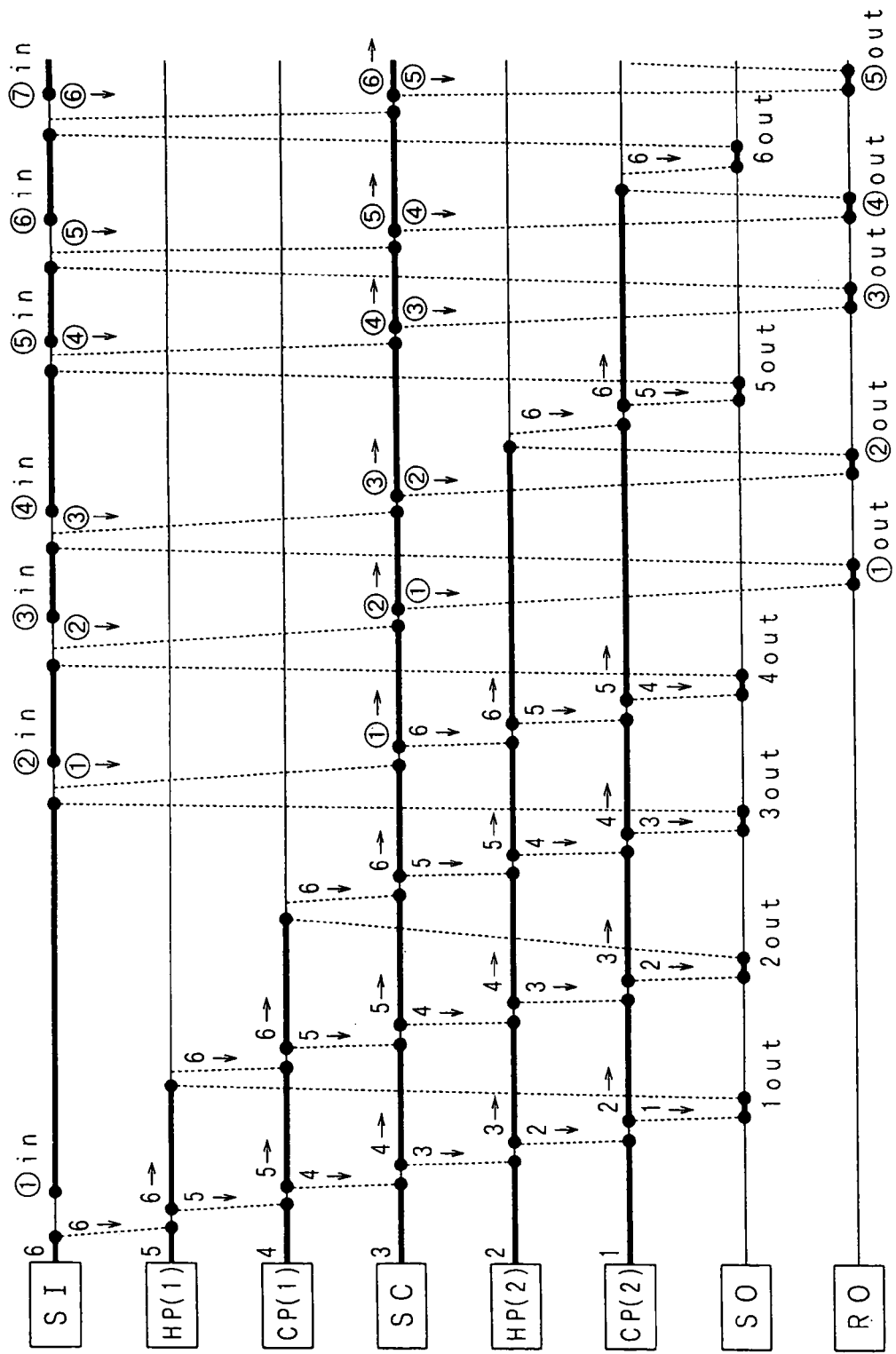
FIG. 12 shows a modification using the other sub-flow.

FIG. 12 shows a relationship between the operation of the second main transport mechanism 10B, the transport situations of substrates W and the processing situations in the respective processing units in the SC cell C3 when the sub-flow F3 shown in FIG. 9C is used in place of the sub-flow F2 of FIG. 9B for processing. The sub-flow F3 differs from the sub-flow F2 in that only the process in the second coating processing unit SC is performed in the SC cell C3. The double-flow processing is similarly implemented in this case.

The substrate No. ① being processed in the sub-flow F3 of FIG. 12 is placed on the feed inlet SI longer than that of FIG. 11, but is transferred outwardly from the return outlet RO earlier because the sub-flow F3 contains fewer processes performed in the SC cell, C3. With the double-flow processing implemented in FIG. 12, the substrates W in the sub-flow F3 and the substrates W in the main flow F1 are transferred outwardly at a ratio of two to one.

In the above-mentioned preferred embodiment, all of the cells are linearly connected together as shown in FIG. 8. The present invention, however, is not limited to this. FIG. 13 shows a connection between cells different from that of the above-mentioned preferred embodiment in an illustrative manner. In a substrate processing apparatus 200 shown in FIG. 13, the SC cell C3, rather than the BARC cell C2, is adjacent to the ID cell C1, and the BARC cell C2 is connected at a branch position. In such a case, the SC cell C3 transfers and receives substrates to and from three adjacent cells, i.e., a total of six substrate rest parts PASS.

Double-flow processing using a main flow F1' and a sub-flow F2' shown in FIG. 13 is such that the double-flow processing using the main flow F1 and the sub-flow F2 shown in FIG. 8 is performed in the substrate processing apparatus 200. In the double-flow processing in FIG. 13, branching of the substrate processing occurs also in the SC cell C3. In accordance with the transport setting established for each cell in the recipe data about the substrate units to be processed in the respective process flows, the cell controllers operate the main transport mechanisms. Thus, a substrate belonging to any substrate unit to be processed is processed in accordance with the transport setting in the SC cell C3. As a result, the double-flow processing is implemented.

If the cells are connected in other relationships or in other arrangements, the double-flow processing is similarly implemented by providing the transport setting for each cell to each substrate unit to be processed.

If there are three or more substrate units to be processed having different transport settings, the present invention may be similarly carried into practice within the limits of the transport capability in the cells.

In the above-mentioned preferred embodiment, the optical sensor S provided in each substrate rest part detects the presence or absence of a substrate W, and the adjacent cell controller responds to the placement state signal from the optical sensor S to cause the corresponding main transport mechanism 10 to receive the substrate W. The substrate transfer may be carried out in different form. For example, the transfer of the substrate W in the substrate rest part may be carried out by providing, to the corresponding cell controller or to the main controller, information about the substrate destination during the transport of the substrate W by the main transport mechanism in accordance with the transport setting determined by the recipe data RD and information about whether or not each of the holding arms of the main transport mechanism holds the substrate W. More specifically, the main transport mechanism is provided with a sensor (not shown) in a suitable position for determining whether or not each holding arm holds a substrate W. When the main transport mechanism which transports successive substrates W in accordance with the transport setting is about to transfer the substrate W held by the main transport mechanism to a substrate rest part for the feed or return direction, the cell controller in the adjacent cell causes a corresponding main transport mechanism to receive the substrate W in response to a signal (holding state signal) indicating information designating the substrate rest part serving as the destination determined by the transport setting and information about a substrate holding state transition (from holding to non-holding or vice versa) of the holding arm in accordance with the transfer operation. In other words, the holding state signal corresponds to the placement state signal. The adjacent cell receives the substrate W to cause the holding state signal to make a transition, whereby the cell from which the substrate W is transferred acquires information indicating that the substrate rest part is emptied of the substrate. This modification eliminates the particular need to provide the optical sensor S in each substrate rest part. Alternatively, both of the optical sensor S in each substrate rest part and the sensor in each holding arm may be used. Also, both of the sensors may be appropriately selectively used in each substrate rest part.

While the invention has been described in detail, the foregoing description is in all aspects illustrative and not restrictive. It is understood that numerous other modifications and variations can be devised without departing from the scope of the invention.

What is claimed is:

1. An apparatus for performing a predetermined process on a group of substrates, the processing procedure of said group of substrates being determined for each substrate unit to be processed including at least one substrate, said apparatus comprising:
- a plurality of cells each including:
- at least one processing unit;
- at least one substrate inlet;
- a plurality of substrate outlets;
- a transport element for transporting a substrate between said at least one processing unit, said at least one substrate inlet and said plurality of substrate outlets; and
- a controller for controlling said at least one processing unit and said transport element,
- wherein said controller in each of said plurality of cells controls said transport element so that a first substrate received into each cell by way of said at least one substrate inlet is transferred outwardly of each cell by way of one of said plurality of substrate outlets which is determined by a first transport setting established for each cell and for a first substrate unit to which said first substrate belongs, so that a second substrate received into each cell by way of said at least one substrate inlet is transferred outwardly of each cell by way of another one of said plurality of substrate outlets which is determined by a second transport setting established for each cell and for a second substrate unit to which said second substrate belongs, and so that said first and second substrates determined to be transferred outwardly by way of said one and said another one of said plurality of substrate outlets by said first and second transport settings are transferred outwardly in the order in which said first and second substrates are ready for outward transfer; and
- a plurality of substrate rest parts provided between adjacent two of said plurality of cells,
- one of said plurality of substrate rest parts serving as said at least one substrate inlet of one of said two adjacent cells, and as one or another one of said plurality of substrate outlets of the other of said two adjacent cells,
- the remainder of said plurality of substrate rest parts serving as one or another one of said plurality of substrate outlets of said one of said two adjacent cells, and as said at least one substrate inlet of said other of said two adjacent cells,
- wherein said controller in each of said plurality of cells determines the order in which substrates are to be transferred outwardly by way of said one of said substrate outlets of each cell by referencing a substrate placement state signal and said transport setting, said substrate placement state signal being applied from a predetermined sensor and indicating whether or not a substrate is placed on a corresponding one of said substrate rest parts.

2. The apparatus according to claim 1, wherein said predetermined sensor is provided in said corresponding one of said substrate rest parts.

3. The apparatus according to claim 1, wherein said predetermined sensor is provided in said transport element.

4. A method of transporting substrates in a substrate processing apparatus, said substrate processing apparatus processing and transporting substrates belonging to a plurality of substrate units to be processed, each of said substrate units including at least one substrate, said substrate processing apparatus including a plurality of cells, each of said plurality of cells including at least one processing unit, at least one substrate inlet, a plurality of substrate outlets, and a transport element for transporting a substrate between said at least one processing unit, said at least one substrate inlet and said plurality of substrate outlets, said method comprising the steps of:
- (a) receiving a substrate into each cell by way of said at least one substrate inlet; and
- (b) transferring said substrate outwardly of each cell by way of any of said plurality of substrate outlets,
- wherein, in said step (b), a first substrate is transferred outwardly by way of one of said plurality of substrate outlets determined by a first transport setting established for each cell and for a first substrate unit to which said first substrate belongs,
- wherein in said step (b), a second substrate is transferred outwardly by way of another one of said plurality of substrate outlets determined by a second transport setting established for each cell and for a second substrate unit to which said second substrate belongs, and
- wherein, in said step (b), said first and second substrates determined to be transferred outwardly by way of said one and another one of said plurality of substrate outlets by said first and second transport settings are transferred outwardly in the order in which said first and second substrates are made ready for outward transfer, wherein:
- said substrate processing apparatus further includes a plurality of substrate rest parts between adjacent two of said plurality of cells,
- one of said plurality of substrate rest parts serving as said at least one substrate inlet of one of said two adjacent cells, and as one or another one of said plurality of substrate outlets of the other of said two adjacent cells,
- the remainder of said plurality of substrate rest parts serving as one or another one of said plurality of substrate outlets of said one of said two adjacent cells, and as said at least one substrate inlet of said other of said two adjacent cells: and
- the order in which substrates are to be transferred outwardly by way of said one of said substrate outlets of each cell is determined by referencing a substrate placement state signal and said transport setting, said substrate placement state signal indicating whether or not a substrate is placed on a corresponding one of said substrate rest parts.

5. An apparatus for performing a predetermined process on a group of substrates, the processing procedure of said group of substrates being determined for each substrate unit to be processed including at least one substrate, said apparatus comprising
- a plurality of cells each including;
- at least one processing unit;
- at least one substrate inlet;
- a plurality of substrate outlets;
- a transport element for transporting a substrate between said at least one processing unit, said at least one substrate inlet and said plurality of substrate outlets; and
- a controller for controlling said at least one processing unit and said transport element,
- wherein said controller in each of said plurality of cells controls said transport element so that a substrate received into each cell by way of said at least one substrate inlet is transferred outwardly of each cell by way of one of said plurality of substrate outlets which is determined by transport setting established for each cell and for a substrate unit to which said substrate belongs, and so that substrates determined to be transferred outwardly by way of said one of said plurality of substrate outlets by said transport setting are transferred outwardly in the order in which said substrates are made ready for outward transfer;

a plurality of substrate rest parts provided between adjacent two of said plurality of cells, one of said plurality of substrate rest parts serving as said at least one substrate inlet of one of said two adjacent cells and as one of said plurality of substrate outlets of the other of said two adjacent cells, the remainder of said plurality of substrate rest parts serving as one of said plurality of substrate outlets of said one of said two adjacent cells and as said at least one substrate inlet of said other of said two adjacent cells, wherein said controller in each of said plurality of cells determines the order in which substrates are to be transferred outwardly by way of said one of said substrate outlets of each cell by referencing a substrate placement state signal and said transport setting, said substrate placement state signal being applied from a predetermined sensor and indicating whether or not a substrate is placed on a corresponding one of said substrate rest parts.

6. A method of transporting substrates in a substrate processing apparatus, said substrate processing apparatus processing and transporting substrates belonging to a plurality of substrate units to be processed, each of said substrate units including at least one substrate, said substrate processing apparatus including a plurality of cells, each of said plurality of cells including at least one processing unit, at least one substrate inlet, a plurality of substrate outlets, and a transport element for transporting a substrate between said at least one processing unit, said at least one substrate inlet and said plurality of substrate outlets, said method comprising the steps of:

(a) receiving a substrate into each cell by way of said at least one substrate inlet; and (b) transferring said substrate outwardly of each cell by way of any of said plurality of substrate outlets, wherein, in said step (b), said substrate is transferred outwardly by way of one of said plurality of substrate outlets determined by transport setting established for each cell and for one of said substrate units to which said substrate said substrate belongs, and wherein, in said step (b), substrates determined to be transferred outwardly by way of said one of said plurality of substrate outlets by said transport setting are transferred outwardly in the order in which said substrates are made ready for outward transfer, wherein:

said substrate processing apparatus further includes a plurality of substrate rest parts between adjacent two of said plurality of cells, one of said plurality of substrate rest parts serving as said at least one substrate inlet of one of said two adjacent cells and as one of said plurality of substrate outlets of the other of said two adjacent cells, the remainder of said plurality of substrate rest parts serving as one of said plurality of substrate outlets of said one of said two adjacent cells and as said at least one substrate inlet of said other of said two adjacent cells: and the order in which substrates are to be transferred outwardly by way of said one of said substrate outlets of each cell is determined by referencing a substrate placement state signal and said transport setting, said substrate placement state signal indicating whether or not a substrate is placed on a corresponding one of said substrate rest parts.

* * * * *